US012340155B2

(12) United States Patent
Raghavan et al.

(10) Patent No.: US 12,340,155 B2
(45) Date of Patent: Jun. 24, 2025

(54) DETECTING INSTABILITY IN COMBINATIONAL LOOPS IN ELECTRONIC CIRCUIT DESIGNS

(71) Applicant: Synopsys, Inc., Sunnyvale, CA (US)

(72) Inventors: Srivatsan Raghavan, Karnataka (IN); Vinod Chandrasekaran, Tamil Nadu (IN); Mikhail Bershteyn, New York, NY (US)

(73) Assignee: SYNOPSYS, INC., Sunnyvale, CA (US)

( * ) Notice: Subject to any disclaimer, the term of this patent is extended or adjusted under 35 U.S.C. 154(b) by 590 days.

(21) Appl. No.: 17/733,266

(22) Filed: Apr. 29, 2022

(65) Prior Publication Data

US 2023/0351085 A1 Nov. 2, 2023

(51) Int. Cl.
*G06F 30/331* (2020.01)
*G06F 30/3308* (2020.01)
(Continued)

(52) U.S. Cl.
CPC ........ *G06F 30/331* (2020.01); *G06F 30/3308* (2020.01); *G06F 30/367* (2020.01);
(Continued)

(58) Field of Classification Search
CPC .. G06F 30/331; G06F 30/3308; G06F 30/343; G06F 30/367; G06F 30/396; G06F 30/398
(Continued)

(56) References Cited

U.S. PATENT DOCUMENTS 5,625,630 A * 4/1997 Abramovici ... G01R 31/318552
714/724
9,053,274 B1 * 6/2015 van Antwerpen .... G06F 30/347
(Continued)

FOREIGN PATENT DOCUMENTS

WO WO-2005029262 A2 * 3/2005 ........... G06F 17/505

OTHER PUBLICATIONS

Cormen, Thomas H., et. al., *Introduction to Algorithms*, Second Edition, Cambridge, Mass: MIT Press, 2001, pp. 552-557.
(Continued)

*Primary Examiner* — Phallaka Kik
(74) *Attorney, Agent, or Firm* — WOMBLE BOND DICKINSON (US) LLP

(57) ABSTRACT

A method includes: loading a circuit design including a plurality of combinational elements and controlled by a user clock; detecting strongly connected components (SCCs) corresponding to the plurality of combinational elements in the circuit design; inserting a plurality of break registers into the circuit design, each break register being between two combinational elements of a corresponding SCC of the SCCs to break the corresponding SCC, the plurality of break registers being clocked by a relaxation clock; detecting, by a processor, during an emulation run of the circuit design, one or more value mismatches across an input pin and an output pin of one or more break registers of the plurality of break registers based on a relaxation cycle of the relaxation clock, the one or more break registers being associated with one or more SCCs exhibiting instability; and reporting an instability event based on the one or more value mismatches.

20 Claims, 12 Drawing Sheets

(51) Int. Cl.
    *G06F 30/343*    (2020.01)
    *G06F 30/367*    (2020.01)
    *G06F 30/396*    (2020.01)
    *G06F 30/398*    (2020.01)
(52) U.S. Cl.
    CPC .......... *G06F 30/343* (2020.01); *G06F 30/396* (2020.01); *G06F 30/398* (2020.01)
(58) Field of Classification Search
    USPC ............... 716/106, 112, 136; 703/16, 17, 28
    See application file for complete search history.

(56) References Cited

U.S. PATENT DOCUMENTS

| | | | |
|---|---|---|---|
| 10,169,518 B1 * | 1/2019 | Iyer ........................ | G06F 30/392 |
| 2005/0062496 A1 * | 3/2005 | Gidon ................... | G06F 30/327 |
| | | | 326/40 |

OTHER PUBLICATIONS

Levy, H., et al., "A Contraction Algorithm for Finding Small Cycle Cutsets," Journal of Algorithms, vol. 9, 1988, pp. 470-493.
Tarjan, Robert, "Depth-First Search and Linear Graph Algorithms," SIAM Journal on Computing, vol. 1, No. 2, 1972, pp. 146-160.

* cited by examiner

DETECTING INSTABILITY IN COMBINATIONAL LOOPS IN ELECTRONIC CIRCUIT DESIGNS

TECHNICAL FIELD

The present disclosure relates to emulation of electronic circuit designs. In particular, the present disclosure relates to a system and method for automatically determining functional instability in an emulated electronic circuit due to combinational loops.

BACKGROUND

Certain types of electronic circuits can exhibit functional instability or oscillatory behavior. Oscillators are sometimes desirable, such as when used to generate clock signals or other repeating patterns. Oscillatory behavior is typically caused, in part, when one or more outputs of a circuit are fed back as one or more inputs to the same circuit, thereby forming a loop. Generally, electrical circuits, or sub-circuits of larger electrical circuits, are expected to generate stable outputs based on their given inputs. However, the presence of loops in the circuit is one potential source of functional instability such that the output of the circuit or sub-circuit is unstable and therefore does not operate as designed.

SUMMARY

According to one embodiment of the present disclosure, a method includes: loading a circuit design including a plurality of combinational elements and controlled by a user clock; detecting a plurality of strongly connected components (SCCs) corresponding to the plurality of combinational elements in the circuit design; inserting a plurality of break registers into the circuit design, each break register being between two combinational elements of a corresponding SCC of the plurality of SCCs to break the corresponding SCC, the plurality of break registers being clocked by a relaxation clock; detecting, by a processor, during an emulation run of the circuit design, one or more value mismatches across an input pin and an output pin of one or more break registers of the plurality of break registers based on a relaxation cycle of the relaxation clock, the one or more break registers being associated with one or more SCCs exhibiting instability; and reporting an instability event based on the one or more value mismatches.

The detecting the one or more value mismatches may include executing an emulation run of the circuit design as a design under test implemented in an emulation system including one or more programmable devices, wherein the processor may control a clock generator to supply a plurality of clock signals to the design under test during the emulation run, the clock signals including: a user clock signal corresponding to the user clock; an emulation clock signal; and a relaxation clock signal corresponding to the relaxation clock, wherein each cycle of the relaxation clock signal may have a period equal to a period of each cycle of the emulation clock signal, wherein, between a first edge and an adjacent second edge of the user clock signal, the clock generator may supply one or more cycles of the emulation clock signal followed by R relaxation clock cycles of the relaxation clock signal.

The method may further include: assigning a unique SCC identifier to each SCC of the plurality of SCCs; storing the one or more value mismatches in association with the unique SCC identifier corresponding to the one or more SCCs exhibiting instability; and generating a trigger signal based on the one or more value mismatches.

The method may further include: disabling readout and storage of a value mismatch in a specified SCC of the plurality of SCCs in accordance with the unique SCC identifier of the specified SCC.

The method may further include: determining that the emulation run was interrupted due to instability based on the trigger signal.

The method may further include identifying the one or more SCCs exhibiting instability based on the unique SCC identifier of the one or more value mismatches.

The reporting the instability event based on the one or more value mismatches may include displaying the unique SCC identifier associated with each of the one or more SCCs exhibiting instability, wherein a driver-load relationship between at least two of the one or more SCCs exhibiting instability may be illustrated using a line-arrow diagram.

The method may further include: assigning a unique SCC identifier to each SCC of the plurality of SCCs; and loading a list of SCC identifiers specifying one or more excluded SCCs from among the plurality of SCCs, wherein the processor may refrain from inserting break registers into the circuit design between combinational elements of the one or more excluded SCCs.

The instability event may be associated with a virtual time based on the user clock.

The method may further include: tracking a number of times instability events are detected from each SCC; and refraining from reporting the instability event when the number of times is below a threshold number.

According to one embodiment of the present disclosure, a system includes: an emulation system including one or more programmable devices; a memory storing instructions; and a processor, coupled with the memory and to execute the instructions, the instructions when executed cause the processor to: load a circuit design including a plurality of combinational elements and controlled by a user clock; detect a plurality of strongly connected components (SCCs) corresponding to the plurality of combinational elements in the circuit design; insert a plurality of break registers into the circuit design, each break register being between two combinational elements of a corresponding SCC of the plurality of SCCs to break the corresponding SCC; program the one or more programmable devices of the emulation system based on the circuit design to implement a design under test; and execute an emulation run of the circuit design using the emulation system, including: detecting one or more value mismatches across an input pin and an output pin of one or more break registers of the plurality of break registers clocked based on a relaxation clock, the one or more break registers being associated with one or more SCCs exhibiting instability; and reporting an instability event based on the one or more value mismatches.

The instructions to execute the emulation run may further include instructions that, when executed, cause the processor to control a clock generator to supply a plurality of clock signals to the design under test, the plurality of clock signals including: a user clock signal corresponding to the user clock; an emulation clock signal; and a relaxation clock signal corresponding to the relaxation clock, wherein each cycle of the relaxation clock signal has a period equal to a period of each cycle of the emulation clock signal, wherein, between a first edge and an adjacent second edge of the user clock signal, the clock generator may supply one or more cycles of the emulation clock signal followed by R relaxation clock cycles of the relaxation clock signal.

The clock generator may supply the R relaxation clock cycles of emulation clock just before the adjacent second edge of the user clock signal.

The instructions may further include instructions that, when executed, cause the processor to: insert a plurality of value mismatch detectors into the circuit design, each value mismatch detector of the plurality of value mismatch detectors having a first input and a second input connected to a D pin and a Q pin of a corresponding break register of the plurality of break registers, wherein the one or more value mismatches may be detected based on a plurality of outputs of the plurality of value mismatch detectors.

The instructions may further include instructions that, when executed, cause the processor to: insert a plurality of value mismatch accumulators into the circuit design, each value mismatch accumulator being configured to collect the outputs of the value mismatch detectors associated with a corresponding SCC of the plurality of SCCs; insert a plurality of SCC sampling registers into the circuit design, each of the plurality of SCC sampling registers being associated with a corresponding one of the plurality of SCCs and a corresponding unique SCC identifier and having an input connected to an output of a corresponding value mismatch accumulator of the plurality of value mismatch accumulators; and store the one or more value mismatches in one or more corresponding SCC sampling registers from among the plurality of SCC sampling registers.

The instructions may further include instructions that, when executed, cause the processor to: insert a plurality of readout enable circuits into the circuit design, each of the readout enable circuits being associated with one of the plurality of SCCs, wherein the readout enable circuit is connected between the corresponding value mismatch accumulator and a corresponding SCC sampling register, wherein the readout enable circuit includes an AND gate having: a first input connected to an output of the corresponding value mismatch accumulator; a second input connected to a corresponding SCC instability readout enable register; and an output connected to an input of the corresponding SCC sampling register.

The instructions may further include instructions that, when executed, cause the processor to: insert an SCC instability accumulation gate, wherein outputs of the plurality of SCC sampling registers are connected to inputs of the SCC instability accumulation gate and the SCC instability accumulation gate is configured to generate a trigger signal reporting an instability event in the one or more SCCs exhibiting instability.

The instructions may further include instructions that, when executed, cause the processor to: insert a global enable SCC instability enable readout circuit connected between an output of the SCC instability accumulation gate and a trigger signal port.

The instructions may further include instructions that, when executed, cause the processor to: interrupt the emulation run in response to detecting the trigger signal.

The instructions may further include instructions that, when executed, cause the processor to: insert a multiplexer configured to selectively clock the plurality of break registers based on the relaxation clock when operating in a diagnostic mode and to clock the plurality of break registers based on a virtual time clock when operating in a production mode.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figure 1:
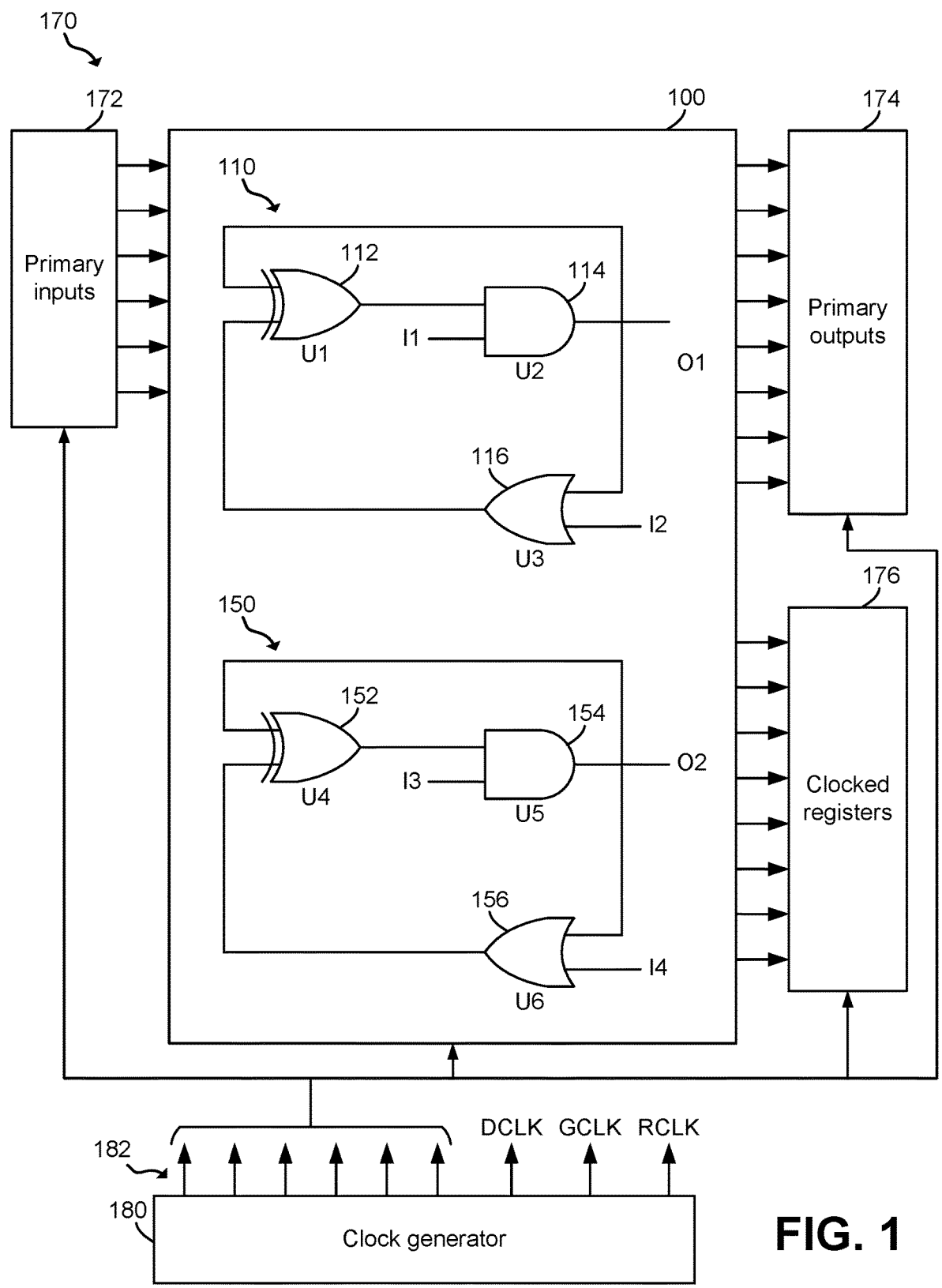
FIG. 1 illustrates an example of two simple combinational loops or strongly connected components (SCCs) in a circuit design.

Aspects of the present disclosure relate to detecting combinational loops in electronic circuit designs.

Designing complex electronic circuits such as microprocessors, digital signal processors, graphics processing units, and the like is a complex and challenging process. Electronic design automation (EDA) tools provide support for generating designs based on specifications of the functional behavior of these electronic circuits. Simulation software and emulation hardware and software respectively simulate and emulate the behavior of the circuit designs to determine whether the electronic circuit design behaves in accordance with specifications.

Functional instability refers to a circumstance where a circuit design generates different or inconsistent outputs (or results) during different emulation runs, even though the circuit is supplied with the same input values. This unpredictability in the behavior of the circuit is undesired, because the circuit does not appear to produce results reliably. In addition, the inconsistent results can cast doubt on the quality (e.g., accuracy) of the emulation system, because it may be unclear whether the inconsistencies were caused by the underlying circuit being emulated or the emulation system that is emulating the design under test (DUT).

Prior methods for testing the functional stability of a circuit typically involve performing multiple execution runs with the same input test vectors to determine if the emulated circuit generates the same results during each emulation run. However, these additional emulation runs are time consuming and expensive. In addition, prior techniques for stability testing typically do not provide controls or parameters for attempting to determine the stability (e.g., consistency) of the results.

Aspects of embodiments of the present disclosure pertain to detecting and diagnosing functional instability in electronic circuits during execution on an emulation platform, where the functional instability arises from combinational loops. The presence of one or more combinational loops in a circuit is a common source of circuit instability. A combinational circuit element or combinational logic element is a part of a circuit that generates outputs based only on the values of its inputs. This may include circuit elements that perform simple logical operations such as AND, NAND, OR, XOR, and NOT. In contrast, a sequential circuit element may have a memory (a register or a latch) that stores some internal state, such that the output of a sequential circuit element may depend both on its inputs and its internal state.

A combinational loop occurs when there is a path through one or more combinational circuit elements where the output of an element is fed back as input to an earlier element in the loop. Some combinational loops, depending on the combinational circuit elements therein, may exhibit oscillatory behavior, such that the combinational loop does not generate a stable output. For example, an odd number of NOT gates connected in a loop will oscillate and therefore will not exhibit stable behavior. Some combinational loops may also exhibit unintended sequential behavior, such as where the particular arrangement of the combinational elements inadvertently results in a sub-circuit that functions like a latch (e.g., a flip-flop or SR latch), thereby causing the combinational loop to store state and thereby generate different outputs for the same inputs in accordance with the stored state information. Therefore, combinational loops are one common source of instability that may be difficult to detect in a circuit design.

Without using the technology of the present disclosure, oscillatory behavior of loops or SCCs may appear as non-deterministic (e.g., random or unpredictable) output of the circuits, where it may be difficult for a designer to determine the underlying source of the non-deterministic behavior, and/or where the non-deterministic behavior is not revealed during emulation, for example, because there is a 50% chance that the non-deterministic portion of the circuit will generate the intended output.

Some aspects of the present disclosure relate to introducing an additional clock, referred to herein as a relaxation clock RCLK having a period equal to that of the emulation clock (referred to as DCLK). A number of relaxation edges are introduced on this additional relaxation clock line prior to incrementing virtual time with the emulation clock held steady (e.g., without edges on the emulation clock DCLK). The relaxation clock controls the operation of break registers inserted into combinational loops, thereby enabling the detection of loop instability events with the signals in the rest of the circuit held steady. This enables controlled study of the oscillatory behavior of loops and SCCs, such as by changing the number of relaxation cycles in order to determine whether an SCC eventually stabilizes or fails to stabilize even after a large number of relaxation clock cycles RCLK.

As such, some technical advantages of the present disclosure relate to providing a structured approach to study, debug, and understanding non-determinism and instability in emulated designs under test that include combinational loops, which provides a circuit designer with additional information for redesigning a circuit, e.g., redesigning the particular combinational loops that exhibit unstable behavior.

Technical advantages of the present disclosure include, but are not limited to, detecting and analyzing the behavior of combinational loops in integrated circuit designs, including determining whether a combinational loop has a damped oscillatory behavior that eventually settles or an oscillatory nature that does not settle while keeping signals in other parts of the emulated design steady (e.g., without clocking sequential parts of the design). Determining the nature of these oscillatory loops or strongly connected components (SCCs) provide analysis techniques and information that were previously unavailable information to circuit designers.

Some technical advantages of the present disclosure relate to reducing the time-to-debug non-deterministic behavior of an emulated circuit, such as by automatically identifying the set of loops or SCCs which may need to be studied in more detail, thereby enabling the circuit designer to focus on the problematic portions of the circuit. The technology of the present disclosure also provides additional information on how the loops or SCCs are related and inter-dependent (driver-load or upstream-downstream relationships) and provides exact emulation time-windows during which instability events occur (e.g., particular user clock cycles with particular inputs that are associated with instability events).

Another technical advantage is that embodiments of the present disclosure can be implemented with low cost in terms of timing and emulation performance because instrumentation hardware can be compiled into the design (or emulation executable) along with automatically inserted break registers to break the loops or SCCs.

For example, one technical advantage of the technology according to the present disclosure relates to allowing the instrumentation to be turned-off during production runs of emulation executable and thereby have no impact on the throughput of the emulation system, where the same emulation executable can also be run in a diagnostic mode with the instrumentation turned on to perform diagnoses of unstable behavior or loop or SCC instability.

Another technical advantage relates to techniques that provide for turning-off selected SCCs from being profiled or instrumented at emulation time in a diagnostic run (e.g., while running an emulation in diagnostic mode) without recompilation of the design from an input design file (e.g., as represented in a circuit description language such as a netlist or a hardware description language (HDL)).

In addition, a technical advantage of the present disclosure relates to selectively turning the instrumentation on or off for a given emulation time window. This enables the user to obtain relevant diagnostic information for emulation time windows of interest (e.g., in response to particular inputs) while maximizing emulation throughput during other time windows.

Another advantage is that the technique does not rely on keeping combinational loops intact with probes attached to loops and monitoring the probes for instability, because these studying non-determinism with loops being intact results in inaccurate timing estimates.

A further technical advantage of the present disclosure relates to techniques to infer the appropriate throughput at which all loops are settled (e.g., based on the number of relaxation cycles needed to settle the loops). This is helpful because production runs can function at this throughput (e.g., with this additional settling time) to perform other emulation analyses of the circuit design while the source of instability is studied or addressed offline by a circuit designer.

Another technical advantage of the present disclosure relates to identifying loops in which the locations of the break registers can be improved.

A combinational loop is a finite set of combinational logic elements which form a path with every logic element occurring once in the path. The output of every logic element is connected to the input of subsequent logic element in the path, and the output of the end logic element connects to an input of the start logic element of the path. In other words, a feedback path exists from an output logic element that generates an output of the combinational loop through the circuit elements of the loop and back as an input to the output logic element. Cyclic combinational circuits contain one or more combinational loops. Circuits which do not have such loops are referred to as acyclic combinational circuits. Combinational loops can be present in the original device under test (DUT) representation (e.g., an input netlist or HDL) generated by a user as input to an emulation system or may arise due to a transformation applied by an emulation toolchain to particular sequential logic elements present in the input DUT representation into a combinational construct, thereby completing a loop across them.

As a sub-set of instances forming a loop can be part of a larger loop, studying/representing such overlapping loops in isolation can be difficult and/or inefficient. Therefore, a set of instances (e.g., circuit elements) that includes one or more (potentially overlapping) combinational loops will be referred to as a strongly connected component (SCC). More precisely, in an SCC, there exists a path from every instance to every other instance in the SCC. A SCC can be represented as a set of instances with external inputs arriving into it and outputs that drive instances that are external to the SCC. Here, external inputs refer to inputs from outside of the SCC, and may be supplied by other elements of a particular electronic circuit design or may be supplied by a source outside of the electronic circuit, such as being provided by a test bench in the case of an emulated circuit as DUT in an emulation system. A single combinational loop is a trivial SCC, and as the term is used herein, an SCC includes one or more combinatorial logic gates. The terms SCC and loop may be used interchangeably herein.

FIG. 1 illustrates an example of two simple combinational loops or strongly connected components (SCCs) in a circuit design 100. In the example shown in FIG. 1, a first SCC 110 includes an XOR gate U1 112 having its output connected to a first input of an AND gate U2 114. An input signal I1 is supplied as a second input to the AND gate U2 114. The output O1 of the AND gate U2 is supplied back as a first input to the XOR gate U1 112. In addition, the output of the AND gate U2 is also supplied as a first input to an OR gate U3 116. Another input signal I2 is supplied as a second input to the OR gate U3 116. The output of the OR gate U3 116 is supplied as a second input to the XOR gate U1 112.

The first SCC 110 includes two combinational loops. A first combinational loop includes a path through XOR gate U1 112 and AND gate U2 114 and from the output of AND gate U2 114 back to one of the inputs of the XOR gate U1 112. A second combinational loop includes a path through XOR gate U1 112, AND gate U2 114, and OR gate U3 and from the output of OR gate U3 back to the other of the inputs of the XOR gate U1 112.

The second SCC 150 is substantially the same as the first SCC 110. In the example shown in FIG. 1, a second SCC 150 includes an XOR gate U4 152 having its output connected to a first input of an AND gate U5 154. An input signal I3 is supplied as a second input to the AND gate U5 154. The output O2 of the AND gate U5 is supplied back as a first input to the XOR gate U4 152. In addition, the output O2 of the AND gate U5 is also supplied as a first input to an OR gate U6 156. Another input signal I4 is supplied as a second input to the OR gate U6 156. The output of the OR gate U6 156 is supplied as a second input to the XOR gate U4 152.

The second SCC 150 includes two combinational loops. A first combinational loop includes a path through XOR gate U4 152 and AND gate U5 154 and from the output of AND gate U5 154 back to one of the inputs of the XOR gate U4 152. A second combinational loop includes a path through XOR gate U4 152, AND gate U5 154, and OR gate U6 and from the output of OR gate U6 back to the other of the inputs of the XOR gate U4 152.

As noted above, the external inputs I1, I2, I3, and I4 may be supplied by other circuit elements of other sub-circuits within the circuit design 100 (e.g., as specified in a netlist or HDL) or may be supplied from an external source, such as a test bench 170, which may supply primary inputs 172 to the emulated circuit design 100 and record primary outputs 174 from the circuit design. In addition, one or more clocked registers 176 may be used to sample the states (values of signals) of various parts of the circuit design 100 during operation and at particular clock cycles, where a clock generator 180 supplies one or more clock signals (e.g., one or more different clock rates CLK1, CLK2, . . . ) 182 to the circuit design 100 (or device under test), the primary inputs 172, the primary outputs 174, and the clocked registers 176. The clock generator 180 also generates additional clock signals including a virtual time clock GCLK signal, emulation clock signal DCLK, and relaxation clock signal RCLK, as will be described in more detail below. In particular, during emulation, the design under test is implemented in an emulation system 902, which may include a set of programmable devices (e.g., field programmable gate arrays). The programmable devices of the emulation system 902 emulate the behavior of the design under test, such as by connecting logic elements of the programmable devices into the circuits specified by the design under test. However, an emulated system typically operates at a slower speed than the intended production system. For example, the design under test may be designed for operation with a clock speed of 1 GHz, but hardware limitations of the emulation system 902 may require the emulation to be performed at a lower clock speed than in a real circuit. Therefore, the term virtual time is used to refer to the passage of time in the emulated environment, as opposed to the term real time, which are used to refer to the passage of time outside of emulation (e.g., as measured by a clock hanging on a wall, where real time may also be referred to as wall time).

Considering the first SCC 110, when external inputs I1 and I2 are both set to the input value of 0, the circuit does not oscillate and remains stable. However, when external inputs I1 and I2 are both set to the input value of 1, then the output O1 of U2 oscillates between 0 and 1 and therefore the SCC 110 is unstable given these particular inputs. As such, FIG. 1 shows examples of combinational loops or SCCs that exhibit stable behavior or unstable behavior depending on the values of the inputs provided to the loops. In practice, many circuit designs are much more complex than the particular examples shown in FIG. 1 and therefore it may be difficult to determine the presence of combinational loops or SCCs in these circuit designs and it may be difficult to automatically determine which particular input values may cause oscillatory or unstable behavior in particular subcircuits. While the example shown in FIG. 1 depicts a first SCC 110 and a second SCC 150 that have the same logical structure, embodiments of the present disclosure are not limited thereto and may be applied to analyze circuits having multiple, different combinational loops and SCCs.

As noted above, while a combinational loop is made up of combinational elements, it is possible for some arrangements of combinational elements to exhibit sequential behavior or sequential nature, such has where the combinational elements are connected in a way that forms a flip-flop or latch. In some circumstances, this sequential behavior is only apparent when particular input values are supplied to the combinational loop, for example, where only particular input values activate paths that result in the flip-flop or latch behavior. Therefore, a combinational loop or SCC may be referred to as having a combinational nature or behavior if the output of the SCC is completely determined by the external input values to the loop and a combinational loop or SCC may be referred to as having a sequential nature or behavior when the output of the loop depends on an internal state of the loop (including the current value of the output of the loop).

In cycle-accurate circuit simulators and in emulation of circuits it is important to know the time taken for a combinational sub-circuit of the circuit to stabilize. For example, the output of a combinational circuit may take some amount of time to stabilize due to the propagation delays of signals through the combinational circuit (e.g., due to the slew rates or speed at which an individual circuit element can change its output state in response to a change in state of one or more of its inputs and based on the length of the paths through the combinational circuit). Accordingly, a combinational circuit or sub-circuit may have an output that fluctuates due to changes over time in the inputs to the final circuit element that computes the output. These fluctuations are commonly referred to as glitches.

Knowing the length of time before the output of a combinational circuit or combinational sub-circuit settles helps to determine the operating clock rate of the one or more clocks 182 (or user clocks or circuit clock CK) such that the outputs of the combinational circuits or sub-circuits are sampled after the outputs have stabilized. In other words, the clock rate may be set to a rate longer than the settling time of a circuit. This is followed by presenting a new set of input stimulus and the sampled register outputs to the combinational part of the circuit during a next clock cycle. These inputs are held steady during the entire stabilization period. This cycle continues until there are new set of test stimulus to be provided to the circuit under test. Every advancement of the clock CK denotes a unit-step (fundamental unit) advancement in state of the circuit and in virtual time.

If the combinational part of the circuit is acyclic, then estimating the stabilization time is equivalent to finding the longest acyclic path in combinational part of the circuit. The stabilization time is accounted by summing up the logic/gate delay and interconnect delay on this path.

Figure 9:
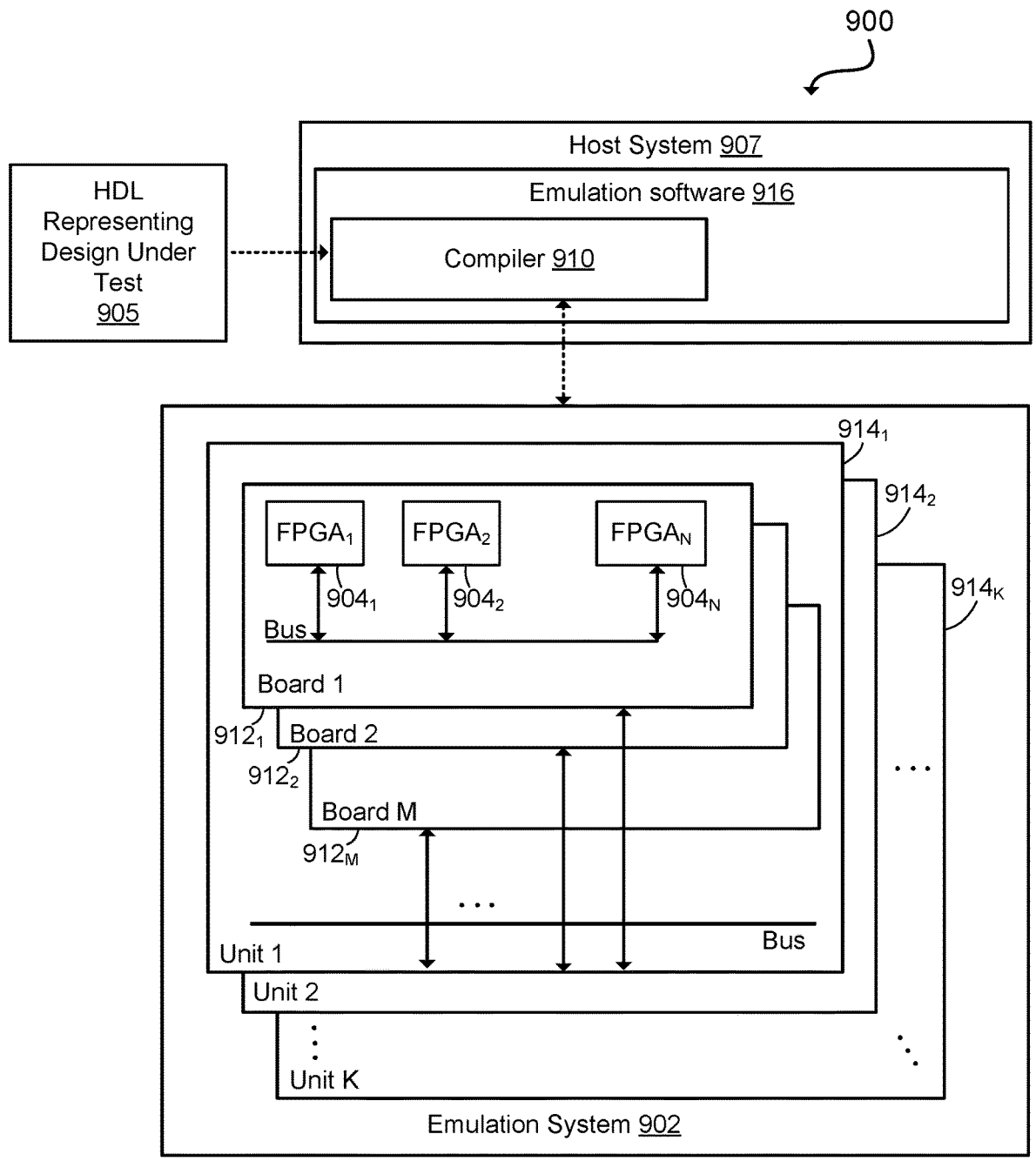
FIG. 9 depicts a diagram of an example emulation system in accordance with some embodiments of the present disclosure.

If a loop exhibits only combinational behavior, then re-synthesis can be applied to the input design (e.g., by a compiler 910 as shown in FIG. 9, where the input design may be represented as, for example, a netlist or in a hardware description language (HDL)) to make the combinational loop acyclic for emulation. However, a combinational sub-circuit may also include cycles and/or loops which can exhibit (or are known to exhibit) sequential nature. For example, inputs which expose sequential nature when presented to the loop sensitizes specific feedback paths causing the output value of the loop to be fed back as an input to the loop. Certain conditions, such as an odd number of logic value inversions in the feedback path and delays involved, can make the loop exhibit oscillatory behavior or damped oscillatory behavior (e.g., where the loop eventually settles to a stable state, but potentially over a long period). Such damped oscillatory behavior may require setting the clock rate of a circuit clock CK to a very long period in order to provide enough time for the combinational circuit to stabilize. In the case of oscillatory behavior that does not stabilize (e.g., the example shown in FIG. 1 when supplied with an input of 1 to both I1 and I2), there is no sufficiently long period of time that will allow the circuit to stabilize.

It is very difficult for static timing analysis tools to model and detect such behavior and to generate appropriate warning to denote the existence of such behavior. In addition, static timing estimates regarding the timing of various circuit elements or standard cells do not hold when such loops are on critical path (e.g., because the loop as a whole may exhibit behavior that increases its settling time beyond that which would be expected from the timing of the individual logic elements of the loop). These differences between expected output and simulated or emulated output will appear as random failures or passes in various emulation runs, therefore making it difficult to debug such issues.

In a typical design under test, different logic blocks may require their own dedicated top-level clock CK 182, as different logic blocks may operate at different clock frequencies. Hence, many designs include a plurality of different top-level clocks CK 182. These clocks may have integral relationships/ratios or can be asynchronous to each other. The test environment, such as a test bench 170 shown in FIG. 1, provides these top-level clocks 182 using a clock generator 180 and ensures causality of clock edges wherever clock-edge relationships are to be maintained.

When circuit designs are mapped to an emulation platform, the emulation software (see emulation system 902) controls these top-level clocks 182. The emulation compiler 910 (see, e.g., FIG. 9) calculates a normalized stabilization time of all combinational logic circuits, factoring the frequency of the clock of that block to the frequency of its associated top-level clock 182. Normalization is applied to account for the permissible delay on combinatorial paths that are contained within a certain clock domain, where the relative frequency of that clock is known with respect to a top level clock. The minimum or the shortest normalized stabilization time among all the top-level clocks decides the fundamental unit of emulation activity or work done in a time-step. An emulation clock DCLK is generated with a width equal to a shortest stabilization time. Without loss of generality, it is assumed that the positive edge of emulation clock DCLK triggers a unit of emulation activity. The width of the emulation clock DCLK in emulation also accounts for how the circuit is placed, routed, and timed on the platform, this takes into consideration the physical/system characteristics of the platform.

During emulation, the emulation system 902 advances the logic state of the circuit design 100 in steps of this fundamental time step according to emulation clock DCLK. The passage of virtual time from the user perspective, e.g., advancing of CKs and consequent state changes of the circuit design, may require multiple such time-steps (units) of emulation activity (e.g., each advancement of CK may require multiple cycles of emulation clock DCLK). The number of emulation cycles DCLK needed to advance a clock cycle CK affects the throughput of the emulation system.

The embodiment shown in FIG. 1 further shows the clock generator 180 as outputting a virtual time clock signal named GCLK, which goes active-high whenever the circuit clock (CK) (e.g., the fastest user clock) is advanced. The active-high edge of virtual time clock GCLK is aligned with an emulation clock DCLK positive edge. In other words, virtual time clock signal GCLK being active signifies presence of an edge on any of the CKs. The throughput of the emulation system can be gauged by the number of virtual time clock signal GCLK edges to the number of emulation clock DCLK positive edges for a given virtual time CK—in other words the amount of wall-clock time or real-time expensed to advance to a given virtual time.

If the sizes of the loops (e.g., the numbers of logic gates in the loops) are small and techniques like formal analysis predict the nature of loop as combinational, then a compiler 910 can insert registers on feedback paths to break the loops with a high degree of confidence, ensuring that no functional mismatch will arise from that loop.

Figure 2:
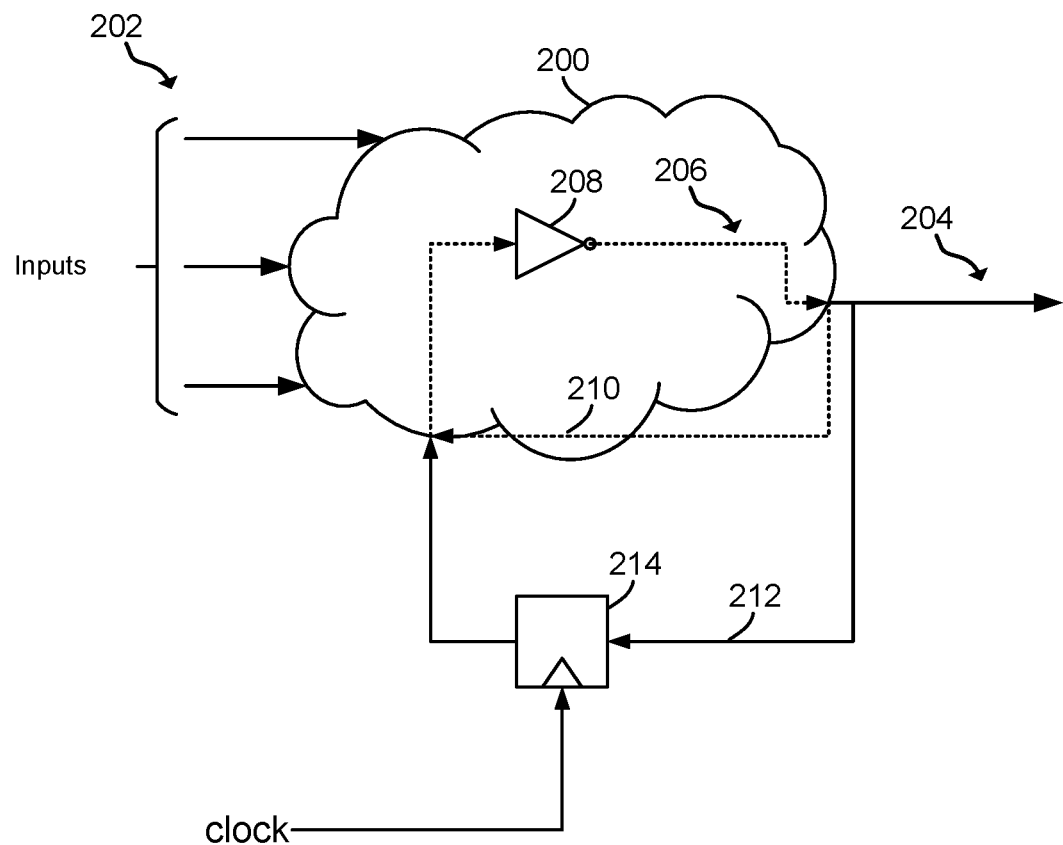
FIG. 2 illustrates a generalized example of an oscillatory loop that includes a break register to break the loop.

FIG. 2 illustrates a generalized example of an oscillatory loop that includes a break register to break the loop. As shown in FIG. 2, a sub-circuit 200 (schematically depicted as a cloud) receives external inputs 202 and generates one or more outputs 204. The sub-circuit 200 includes a loop 206 that may exhibit oscillatory behavior due to the presence of an odd number of inverters 208 in the path, where the oscillatory behavior may depend on the values of the inputs 202 to the sub-circuit 200.

A feedback path 210 from an output of the combinational loop back to an input of the combinational loop is replaced with a path 212 that includes a breaking register 214 that is typically clocked on virtual time clock signal GCLK because the total sum of virtual time clock GCLK edges is constant for a given duration of virtual time, which provides predictability to the behavior of the circuit with the loop broken by the breaking register 214. Additionally, the virtual time clock signal GCLK is available across the entire emulation platform (e.g., available in all clock domains), whereas other clocks, such as the fastest of user clock among the CKs 182 might already be routed only to the clock domains that use those clocks, and therefore this additional clock would need to be routed to all blocks containing loops. In the emulation domain, clock-tree inferencing is usually lenient (to reduce time-to-emulation) vis-à-vis ASIC-flow, and therefore it is quite common to find loops that span multiple clock domains. In addition, in emulation it is possible for the user to stop a select subset of top-level user clocks CK. Therefore, the breaking registers are typically controlled by a clock that is within the control of the emulation compiler 910.

As such, for all inputs which exhibit combinational nature, the output 204 of the loop matches the output of an unbroken loop. When inputs 202 which expose the oscillatory nature of the loop are presented to the loop and held steady, the output value for an even number of virtual time clock GCLK edges will be the inverse of its output value when an odd number of virtual time clock GCLK edges are provided to the break register 214. Because virtual time clock GCLK edges are dependent upon timing of edges of top-level CKs, the value at the output of such oscillatory loops depends on those virtual time clock GCLK edges. During emulation, it is possible that such oscillatory loops may generate values that hide the oscillatory nature of the loop (e.g., there is a 50% chance that the loop will output the correct value consistent with the specified behavior of the circuit) and therefore the presence of an oscillatory loop may never be revealed by the emulation runs. The randomness and unpredictability of the results of these emulation runs introduces circuit debugging challenges, especially because any modifications to the circuit, such as through the insertion of hardware and circuits to observe the state of the circuit, can mask the source or expose different non-deterministic behavior and because single emulation runs often take hours or days of wall time (elapsed real time).

If the size of a loop or SCC is large, then a large number of break registers may be needed to break all feedback paths. Consider, for example, a loop or SCC which takes k break registers to break all feedback paths. If there exists a simple path between an input and an output of this SCC that passes through m break registers exactly once, where m≤k, then, in the worst case, m virtual time clock GCLK edges will be required for the output to reflect the input's change. If the inputs to this SCC were to change within m virtual time clock GCLK edges, then it is certain that this SCC has had insufficient time to evaluate completely (e.g., compute its output state by propagating the signal through the k break registers to reach the output) for the previous input. Therefore, large SCCs may exhibit insufficient evaluation due to the placement of break registers, thereby making it more difficult to detect a loop or instability using those break registers.

As such, the presence of loops in a circuit has the potential to exhibit randomness or unpredictability during emulation. The technique of introducing break registers to break loops brings determinism in majority of the cases, but can sometimes also cause non-determinism, depending on, for example, the placement of the break registers and the length of the loop.

Automatic register insertion on loops by the compiler 910 may bring predictability to a stability test during emulation, but, as discussed above, this technique alone is insufficient to establish confidence that the results are robust, as the results may be sensitive to changes in the global clocking scheme and/or changes in an input vector or input vectors supplied during an emulation run. This uncertainty can allow potential design errors to pass through simulation and emulation undetected, such that an unreliable design is ultimately fabricated, thereby resulting in potential losses or failures of the integrated circuit in deployment in consumer devices. For example, what may appear to be a successful emulation run with correct results could actually have been due to oscillatory loops that happened to result in the correct values during those emulation runs.

Accordingly, aspects of embodiments of the present disclosure relate to techniques for detecting and analyzing combinational loops or SCCs during emulation, thereby enabling designers of integrated circuits to catch and fix design errors that may cause unstable or unpredictable behavior in real, fabricated circuits. In more detail, aspects of embodiments of the present disclosure relate to providing circuit designers with additional runtime information about potential combinational loops and SCCs that are present in the design and to improve the quality of the break registers inserted by a compiler. Aspects of embodiments of the present disclosure also relate to providing automatic breaking register insertion and diagnosing the root cause of unstable (e.g., oscillatory) combinational loops that can cause non-determinism (e.g., due to uncertainty as to which point in the oscillation an output of the loop will be sampled) or potential failure in the circuit at run time.

In general, when an SCC or loop is presented with new set of stimuli on its inputs, it may undergo a value change on its internal wires and its outputs. (E.g., when new values are supplied to inputs 202 of FIG. 2, the internal wires such as the inputs and outputs of inverter 208 along the path 206 and the output 204 may undergo value change.) If the stimuli are held steady for a duration longer than the stabilization time of the SCC (e.g., the amount of time for signals to propagate through the logical elements along paths from the inputs to the outputs of the SCC, such as from the time of applying the new input values to inputs 202 to detecting a change at the output 204), then any internal or output wire should show no further value change after that stabilization time has elapsed. This implies that for all internal wires or output wires, the value on the wire is in conformance with the input values of the logic gate or logical element that drives the wire.

If an internal wire or an output wire were to be broken by the introduction of a breaking register (e.g., breaking register 214), then, with stimuli being held steady and that breaking register clocked, say for k cycles where k>1 with each cycle's duration equal to stabilization time of the SCC, this should result in no value mismatch across the register's D and Q pins (e.g., the same value appears at the input pin and output pin of the breaking register 214). If this condition is met by all break registers of the SCC, then the SCC is considered to have settled for that stimuli.

However, if a value mismatch or difference were to persist across the D and Q pins of a breaking register for k>1 cycles, then this indicates that the SCC has not yet settled, possibly due to having had insufficient time to stabilize (e.g., the input and output pins of the breaking register 214 have different values). In such case, the inputs to the SCC (e.g., the values supplied to the inputs 202) can continue to be held steady and the breaking registers can be clocked for additional cycles. If the value mismatch or value difference across break register continues to exist for a sufficiently large number of additional cycles (a large value of k), then the SCC can be classified as oscillatory or unstable for the set of the inputs presented to it. If the value mismatch ceases to exist after k cycles, then the magnitude of k is reflection/correlation of quality of breakpoints and their placement, and it may be possible to identify a better quality of breakpoints which can result in a lower value of k for such an SCC.

Holding the inputs steady for a SCC in emulation can be achieved if a fixed number of additional emulation cycles for clocking the break registers is introduced before every edge of a user clock CK, e.g., whenever virtual time is advanced. The additional emulation cycles are referred to herein as relaxation cycles and controlled by a relaxation clock RCLK. Each relaxation cycle has a period equal to the period of emulation clock DCLK.

Figure 3:
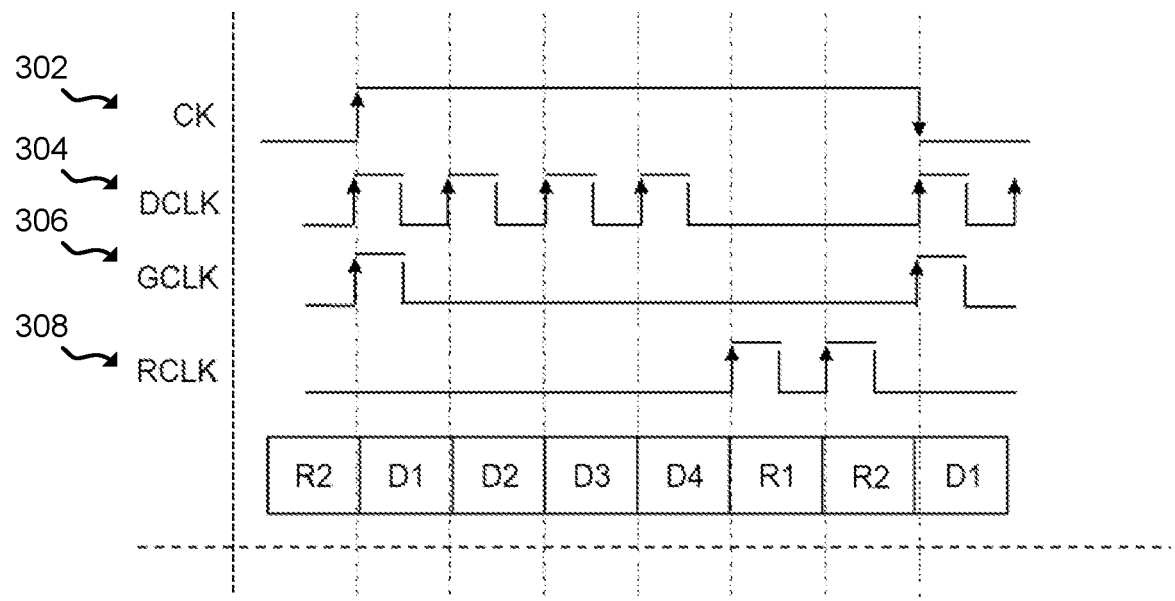
FIG. 3 is a timing diagram illustrating clock signals supplied to an emulated circuit by a clock generator of an emulation system according to some embodiments of the present disclosure.

FIG. 3 is a timing diagram illustrating clock signals supplied to an emulated circuit by a clock generator of an emulation system according to some embodiments of the present disclosure. The timing diagram of FIG. 3 shows a first edge and an adjacent second edge of a user clock CK 302 (e.g., the first edge is a rising edge and the second edge is a falling edge that is adjacent or consecutive in time, with no other user clock edges between them). The particular example shows four cycles of emulation clock DCLK 304 which, as discussed above, are used to advance the propagation of signals through the paths of the circuit. design. There can be any number of emulation clock DCLK edges to move the state the hardware under test from positive edge of user clock CK 302 to the succeeding negative edge of user clock CK 302. The virtual time clock GCLK 306 in FIG. 3 indicates the passage of virtual time by aligning its rising edge with the edges (e.g., both the rising edge and the falling edge) of user clock CK 302.

According to various embodiments, the clock generator 180 generates a relaxation clock RCLK 308 which has a period equal to that of emulation clock DCLK. The RCLK clock edges are introduced by emulation clock control logic of an emulation system 902 before incrementing the virtual time clock GCLK edge. The number of relaxation clock RCLK 308 edges to be introduced before the next virtual time clock GCLK edge is configurable by a user and corresponds to the value k, described above, and may also be denoted by R. In some embodiments the number of relaxation clock RCLK 308 constant for an entire emulation run. As such, a user clock cycle (e.g., between two adjacent edges of a user clock CK 302) can be divided into a sequence of emulation clock DCLK cycles (labeled in FIG. 3 as four emulation clock DCLK cycles D1, D2, D3, and D4) followed by R (or k) relaxation cycles or RCLK cycles (labeled in FIG. 3 as two RCLK cycles R1 and R2). During a relaxation cycle (e.g., R1 and R2) the emulator performs no other hardware activity (e.g., maintains the inputs to the SCC as constant) because emulation clock DCLK is frozen during the relaxation cycles and the relaxation clock only clocks the break registers and performs a propagation of signals through the SCC based on the output of the break registers.

As such, embodiments of the present disclosure provide an emulation system that can clock the break registers for a number of cycles before advancing virtual time (before advancing user clock CK 302). Because emulation clock DCLK is frozen during this time, any hardware activity unrelated to SCC is curbed and any change in the state is entirely attributable to clocking of break registers or due to state changes in SCCs. As such, embodiments of the present disclosure allow emulation systems to detect the effect of SCC stabilization on the hardware state in a circuit design.

Figure 4:
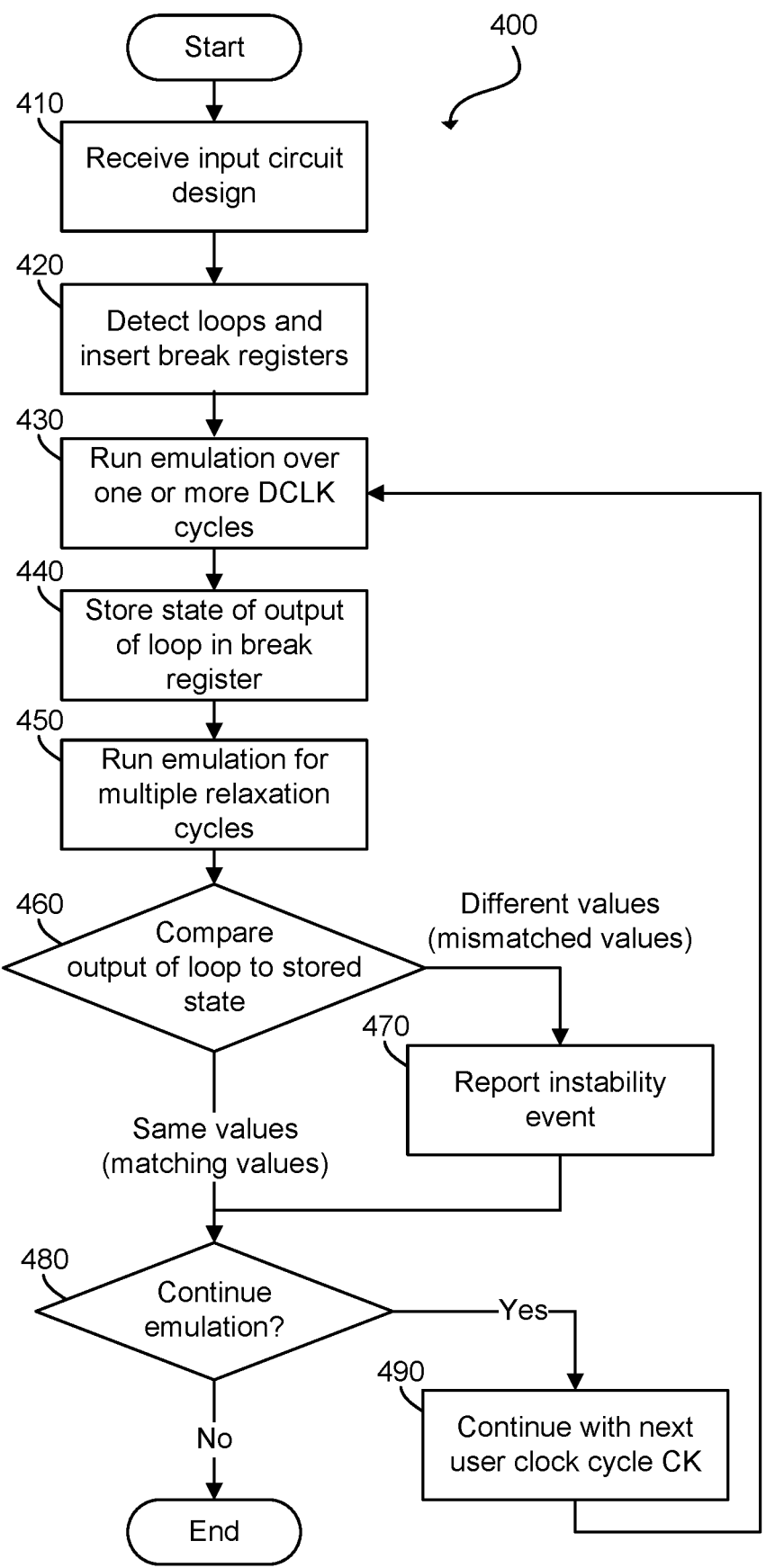
FIG. 4 is a flowchart of a method for detecting combinational loops or SCCs in a circuit design under emulation by an emulation system according to some embodiments of the present disclosure.

FIG. 4 is a flowchart of a method 400 for detecting combinational loops or SCCs in a circuit design under emulation by an emulation system according to some embodiments of the present disclosure.

At 410, a compiler receives an input circuit design. The input circuit design may be expressed in a data format for representing electronic circuits, such as a netlist that includes a plurality of combinational elements (e.g., logic gates) that are connected into one or more sub-circuits that make up the input circuit design. The example circuit design 100 of FIG. 1 shows one example of an input circuit design that includes combinational elements that are connected as one or more paths.

As noted above, the two SCCs 110 and 150 shown in FIG. 1 both have oscillatory nature, in that the first SCC 110 oscillates when I1 and I2 take the logic value 1, and similarly, the second SCC 150 oscillates when I3 and I4 take the logic value 1.

At 420, the compiler identifies such SCCs in the input circuit design and inserts break registers into the SCC until there are no further SCCs. Some embodiments apply algorithms relating to detecting SCCs in directed graphs, such as by using a depth-first search to compute finishing times for each vertex (corresponding to a combinational element) in a directed graph representing the circuit (where each edge connects an output of a combinational element to an input of another combinational element), computing a transpose of the graph (e.g., where the direction of the directed edges are reversed such that the each edge points from the input of a combinational element to the output of another combinational element). Depth-first search algorithm is then applied to the transposed graph, but where the vertices are considered in order of decreasing finishing time, as computed during the depth-first search of the original graph. The vertices of each tree in the depth-first forest generated by the second depth-first search of the transposed graph correspond to separate SCCs. For example, some embodiments, an SCC is detected by following paths through the combinational elements of a circuit design from output pins of a combinational element to input pins of a next combinational element. In some embodiments, the compiler 910 performs a breadth-first search or depth-first search through one or more graphs formed by combinational elements of the circuit design, where each node in the graph is a combinational element and a combinational element receiving an input from an external source or a sequential element may be used as a starting node or root node. As the compiler visits each combinational element node in the graph, the compiler maintains a data structure storing identifiers of all visited circuit elements (stopping any search of any particular path when a sequential element such as a register is reached), and detects the existence of a loop or SCC when the path leads to a previously visited circuit element (e.g., where all circuit elements along the path from the re-visited element to the last element are part of the SCC.

Figure 5A:
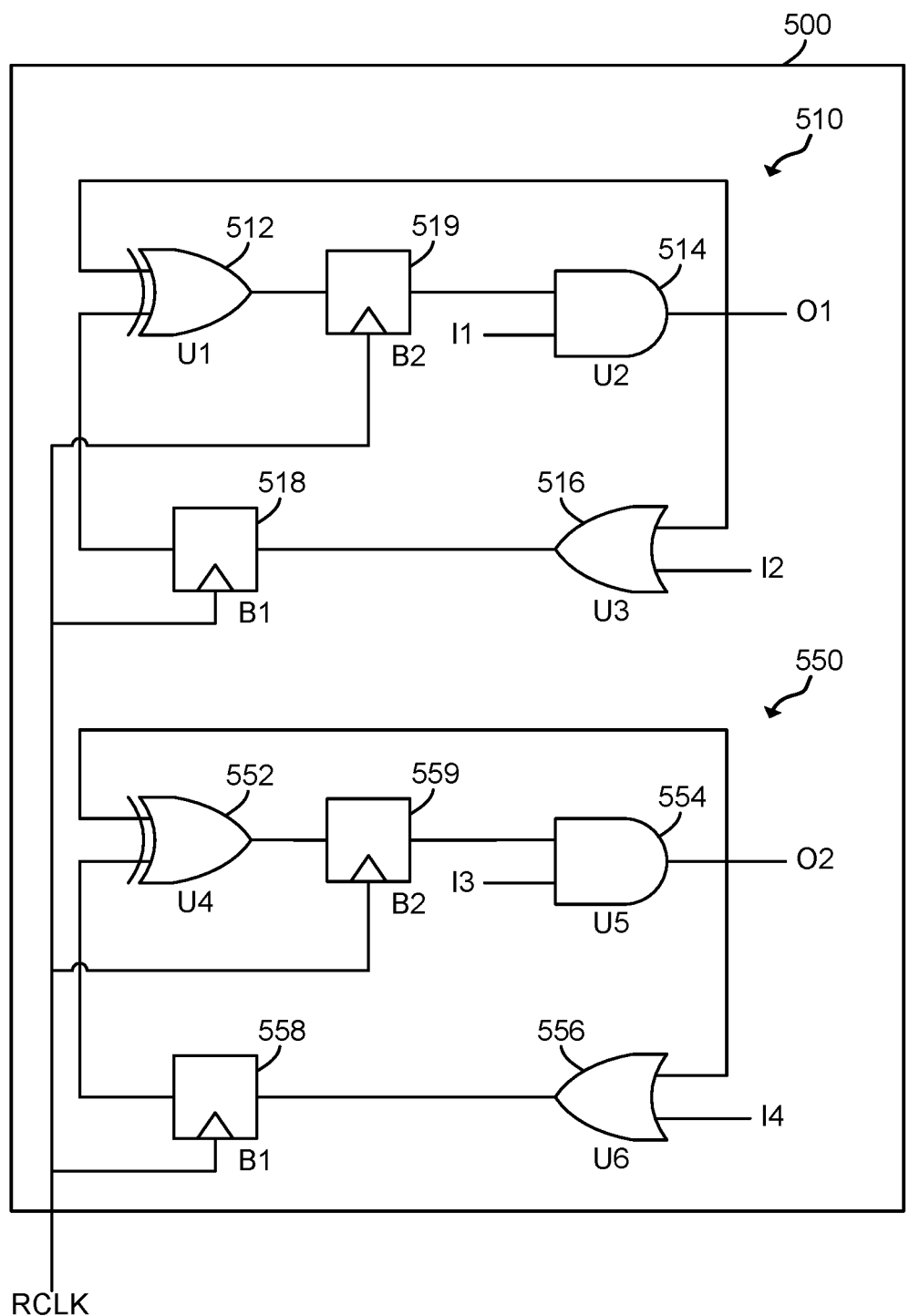
FIG. 5A depicts an example of a circuit design with break registers automatically inserted into the design to break loops or SCCs according to one embodiment of the present disclosure.

In some embodiments, the compiler 910 automatically inserts break registers between at least one pair of elements along the path corresponding to a detected loop or SCC. In some embodiments, determining locations at which to insert break registers in an SCC is analyzed in accordance with computing a minimum-feedback vertex set (MFVS), where a feedback vertex set (FVS) of a graph (e.g., a combinational circuit) is a set of vertices whose removal leaves the graph without cycles. Computing an MFVS is computationally intensive, especially when the number of nodes in the graph is large (e.g., when there are a large number of combinational elements in the circuit). Accordingly, some embodiments relate to the use of algorithms for computing approximations of MFVS as constrained by computational complexity in compute time and space, where the approximation attempts to compute an FVSs that is small, but which may or may not be minimal, where the quality of the approximation may depend on the time budget and memory budget of the computing system. Identifying vertices that can be removed from the graph to break the cycles can then be transformed into identifying edges of the graph that can be removed to break cycles, thereby identifying locations at which to insert break registers. Similarly, in some embodiments, the compiler computes a feedback edge set from an input graph, which similarly identifies a set of edges whose removal makes the input graph acyclic. For example, in one embodiment, the compiler computes a spanning forest to find a set of edges that reach all of the nodes in the graph, without cycles. Accordingly, subtracting this identified set of edges from all edges of the graph identifies edges that can be removed in order to break the cycles in the original graph. FIG. 5A depicts an example of a circuit design with break registers automatically inserted into the design to break loops or SCCs according to one embodiment of the present disclosure. The example shown in FIG. 5A is substantially similar to that shown in FIG. 1, apart from the addition of break registers.

In the example shown in FIG. 5A, temporarily setting aside description of the break registers, a first SCC 510 includes an XOR gate U1 512 having its output connected to a first input of an AND gate U2 514. An input signal I1 is supplied as a second input to the AND gate U2 514. The output O1 of the AND gate U2 is supplied back as a first input to the XOR gate U1 512. In addition, the output of the AND gate U2 is also supplied as a first input to an OR gate U3 516. Another input signal I2 is supplied as a second input to the OR gate U3 516. The output of the OR gate U3 516 is supplied as a second input to the XOR gate U1 512.

The first SCC 510 includes two combinational loops. A first combinational loop includes a path through XOR gate U1 512 and AND gate U2 514 and from the output of AND gate U2 514 back to one of the inputs of the XOR gate U1 512. A second combinational loop includes a path through XOR gate U1 512, AND gate U2 514, and OR gate U3 and from the output of OR gate U3 back to the other of the inputs of the XOR gate U1 512.

The second SCC 550 is substantially the same as the first SCC 510. In the example shown in FIG. 5A, a second SCC 550 includes an XOR gate U4 552 having its output connected to a first input of an AND gate U5 554. An input signal I1 is supplied as a second input to the AND gate U5 554. The output O2 of the AND gate U5 is supplied back as a first input to the XOR gate U4 552. In addition, the output of the AND gate U5 is also supplied as a first input to an OR gate U6 556. Another input signal 2 is supplied as a second input to the OR gate U6 556. The output of the OR gate U6 556 is supplied as a second input to the XOR gate U4 552.

The second SCC 550 includes two combinational loops. A first combinational loop includes a path through XOR gate U4 552 and AND gate U5 554 and from the output of AND gate U5 554 back to one of the inputs of the XOR gate U4 552. A second combinational loop includes a path through XOR gate U4 552, AND gate U5 554, and OR gate U6 and from the output of OR gate U6 back to the other of the inputs of the XOR gate U4 552.

As shown in FIG. 5A, introducing first break register B1 518 and second break register B2 519 makes the first SCC 510 acyclic while introducing third break register B3 558 and fourth break register B4 559 makes the second SCC 550 acyclic. The number of registers introduced to make SCC acyclic depends on the structure of the SCC. As will be described in more detail below, in a diagnostic mode to investigate the behavior of the SCCs, the break registers 518, 519, 558, and 559 (B1, B2, B3, and B4) are clocked by the relaxation clock RCLK. While the example shown in FIG. 5 depicts a first SCC 510 and a second SCC 550 that have the same logical structure or circuit layout, embodiments of the present disclosure are not limited thereto and may be applied to analyze circuits having multiple, different combinational loops and SCCs.

Figure 5B:
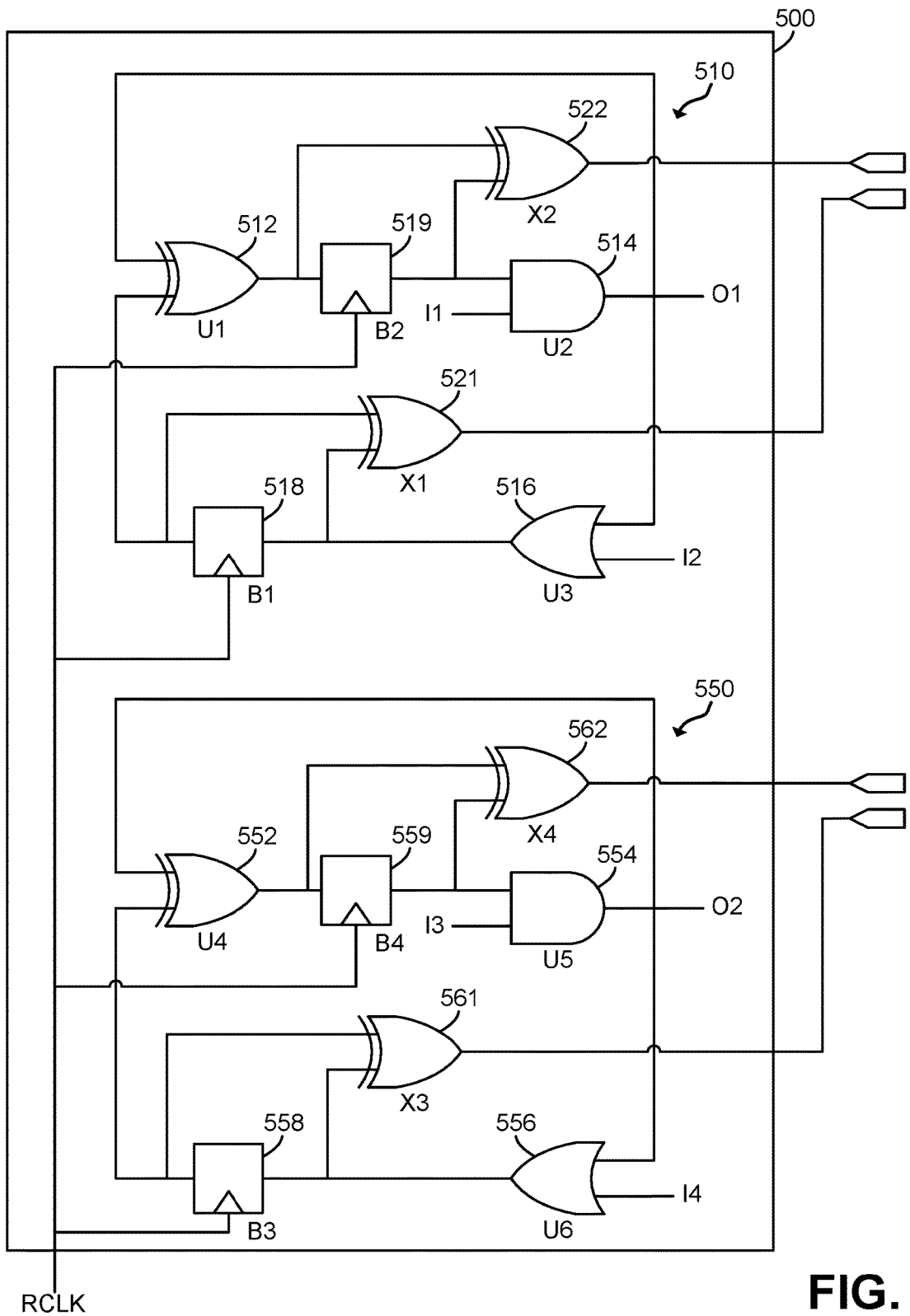
FIG. 5B depicts an example of a circuit design with break registers and logic gates automatically inserted into the design to detect value mismatches across the break registers according to one embodiment of the present disclosure.

FIG. 5B depicts an example of a circuit design with logic gates automatically inserted into the design to detect value mismatches across the break registers according to one embodiment of the present disclosure. In the example shown in FIG. 5B, To detect value mismatches across the break registers 518, 519, 558, and 559 (B1, B2, B3 and B4) the compiler 910 introduces value mismatch detector XOR logic elements 521, 522, 561, and 562 (X1, X2, X3 and X4) respectively. These value mismatch detector XOR logic elements (or value mismatch detectors) 521, 522, 561, and 562 have inputs connected across the D pin and Q pin of their corresponding break registers 518, 519, 558, and 559. If the values on the input terminals of a value mismatch detector XOR logic element (X1, X2, X3 or X4) are same then the XOR logic element outputs logic value 0, whereas if the input values are different then the XOR logic element outputs logic value 1. As such, connecting a value mismatch detector XOR logic element across the D and Q pins of a break register causes the value mismatch detector XOR logic element to output a logic value 0 when there is no change in the output of the combinational logic element immediately upstream of the break register (e.g., having its output connected to the D pin of the break register) between the previous and current relaxation cycle RCLK and to output a logic value 1 when a value mismatch or logic value change is detected between the current output of the upstream combinational logic element and the previously stored output of the upstream combinational logic element.

In more detail, and referring back to FIG. 3 and FIG. 4, at 430 the emulation system runs an emulation of the system for one or more emulation clock DCLK cycles 304, which propagates signals through the combinational elements of the circuit design, but where the loops are broken by the break registers inserted at 420. At 440, the state of an output of the loop (e.g., the output of at least one combinational logic element of the loop) is saved in a break register. For example, referring to FIG. 5B, the output of OR gate U3 516 is saved in first break register B1 518 and the output of XOR gate U1 512 is saved in second break register B2 519 and the output of OR gate U6 556 is saved in third break register B3 558 and the output of XOR gate U4 552 is saved in fourth break register B4 559.

At 450, the emulation system runs the emulation of the circuit for multiple relaxation cycles in accordance with relaxation clock RCLK (see FIG. 3 and RCLK 308). During the relaxation cycles, the inputs (e.g., inputs I1, I2, I3, and I4 of FIG. 5B) are held constant and only the break registers are clocked, thereby causing the break registers to sample new outputs of the immediately upstream combinational element.

At 460, the emulation system compares the output of a loop to a state stored in a break register, such as by checking the values output by the value mismatch detector XOR gates connected across the D and Q pins of the break registers. A value mismatch detector XOR gate that detects the same values (or matching values) will output a logical 0, indicating that the output of the immediately upstream combinational logic element was stable, and a value mismatch detector XOR gate that detects different values (or mismatched values) will output a logical 1, indicating that the output of the immediately upstream combinational logic element was unstable between these two relaxation cycles. When a value mismatch detector XOR gate detects different values, then at 470 the circuit reports an unstable loop in an associated one of the SCCs, as discussed in more detail below.

Figure 5C:
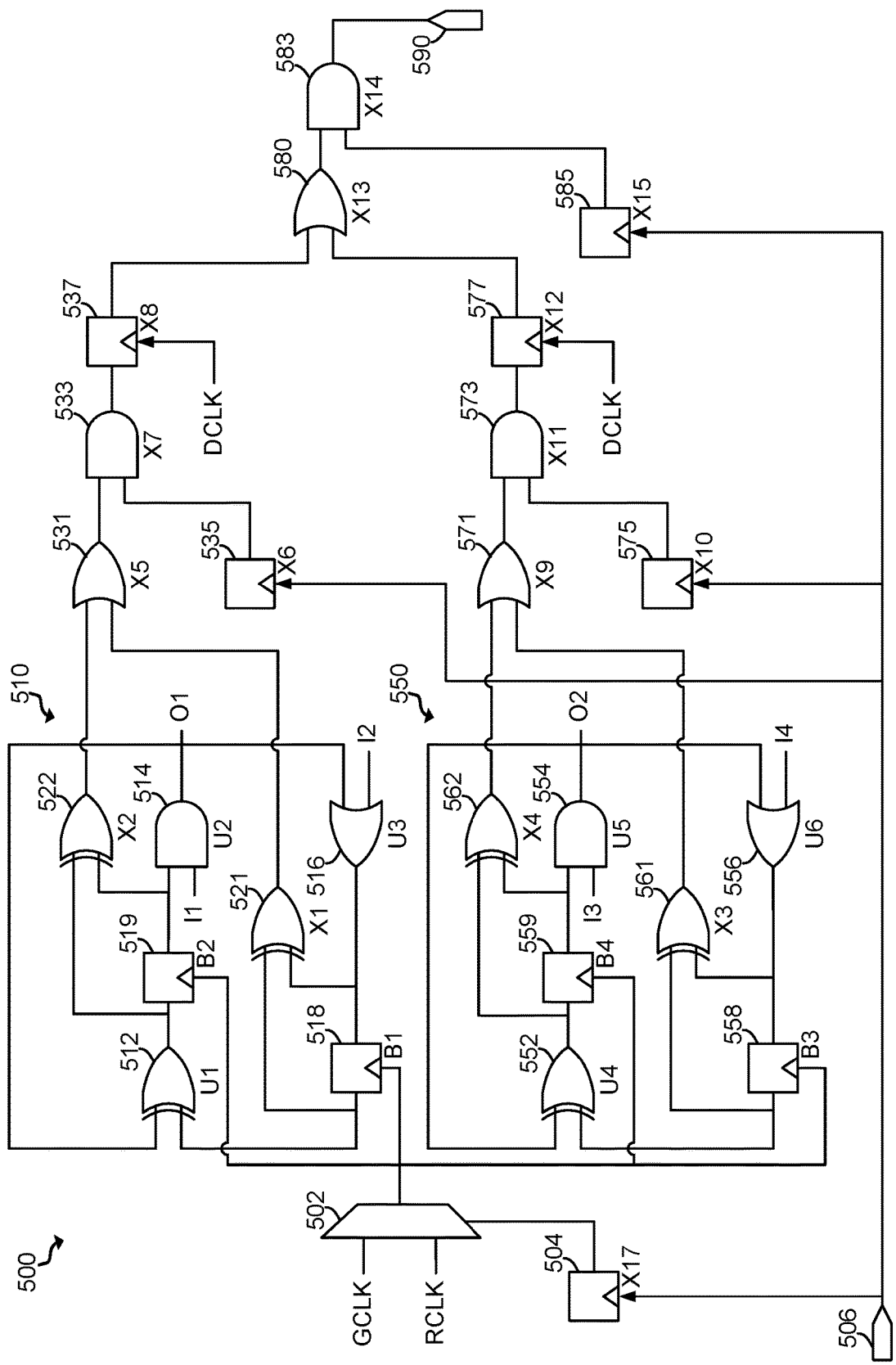
FIG. 5C depicts an example of a circuit design with break registers, logic gates, and readout logic automatically inserted into the design to detect value mismatches across the break registers and report the detected value mismatches according to one embodiment of the present disclosure.

FIG. 5C depicts an example of a circuit design with break registers, logic gates, and readout logic automatically inserted into the design to detect value mismatches across the break registers and report the detected value mismatches according to one embodiment of the present disclosure. In more detail, the circuit of FIG. 5C provides one example of a circuit under emulation after a compiler has automatically inserted break registers, logic gates, and readout logic into the input circuit shown in FIG. 5A.

Any value mismatch at the break registers from each SCC are logically OR-ed by connecting the outputs of the value mismatch detector XOR gates associated with an SCC to the inputs of a corresponding OR gate for the SCC. For example, the outputs of value mismatch detector XOR gate X1 521 and value mismatch detector XOR gate X2 522 are both connected to a value mismatch accumulator gate X5 531 to collect all of the detected value mismatches for the first SCC 510. Likewise, the outputs of value mismatch detector XOR gate X3 561 and value mismatch detector XOR gate X4 562 are both connected to a value mismatch accumulator gate X9 571 to collect all of the detected value mismatches for the second SCC 550. In other words, a value mismatch accumulator outputs 0 if all of the break registers indicate a stable output of the SCC and the value mismatch accumulator outputs 1 if any of the break registers show a value mismatch (e.g., a difference in value between different relaxation cycles RCLK). The width of the OR gate or value mismatch accumulator gate depends on the number of value mismatch detector XOR gates present in a given SCC.

The outputs of the value mismatch accumulator gates X5 531 and X9 571 are connected (via readout enable circuits, described in more detail below) to the enable pin (CE) of SCC sampling registers X8 537 and X12 577, respectively. SCC sampling register X8 537 and SCC sampling register X12 577 are enabled only when a logic value of 1 is present on their enable pin. These SCC sampling registers X8 and X12 will store a value 1 when they are enabled and when an active positive edge occurs on the emulation clock DCLK. A positive edge on emulation clock DCLK signifies an end of emulation cycle on the user clock CK (see, e.g., FIG. 3, because after the relaxation clocks, the next user clock edge CK is aligned with the next emulation clock DCLK positive edge). As such, SCC sampling registers X8 and X12 record the instability event detected in their associated SCCs (the first SCC 510 and the second SCC 550, respectively) during a previous emulation cycle.

As shown in FIG. 5C, the outputs of SCC sampling registers X8 537 and X12 577 are connected to an SCC instability accumulation gate X13 580 (e.g., a logical OR gate), which collects the detections of instability events during the emulation run across all of the SCCs (e.g., first SCC 510 and second SCC 550). The width of the input to the SCC instability accumulation gate X13 580 is equal to (or greater than) the number of the SCCs instrumented for instability, as determined by the compiler 910. The SCC instability accumulation gate X13 580 generates an output having logic value 1 when there was an instability event in the previous emulation cycle on any of the SCCs in the device under test. The output of the SCC instability accumulation X13 gate is connected, through a global readout enable circuit) to a trigger signal port 590 that can be read by, for example, debug sub-system of emulation software 916 running on a host system 907 that manages the emulation run.

Accordingly, in some embodiments, at 470 a logic value of 1 on the trigger signal 590 reports the occurrence of an instability event during emulation. In some embodiments, the detection of an instability event causes, for example, a run time sub-system of emulation software 916 running on the host system 907 to interrupt emulation (e.g., to generate an indication to stop emulation at 480) and to handle, process, and address the instability event, such as by providing a user with information regarding the inputs that resulted in the instability event and, as discussed in more detail below, an identifier associated with an SCC that produced the instability event.

If no instability event was detected, then at 480 the system may determine whether emulation is to continue, such as based on whether a specified number of user clock cycles have been run or based on control information from the emulation software running on the host system. If emulation is to stop, then the process ends. If emulation is to continue with the next user clock cycle CK at 490, then the process continues at 430 by running the emulation over one or more emulation clock DCLK cycles.

Some aspects of embodiments of the present disclosure relate to selectively enabling and disabling SCC and loop instability analysis. In particular, this allows a user to selectively activate and deactivate the SCC and loop instability analysis functionality by setting an input value to the device under test through diagnostic mode input port 506, without needing to recompiling the input design when switching between modes. This allows the user to perform emulation runs with the SCC and loop instability analysis functionality deactivated to increase emulation throughput, and also to activate SCC and loop instability analysis to investigate potential combinational loop instability as needed.

In more detail, in some embodiments, the compiler 910 is further configured to insert a multiplexer 502 having a select line connected to a relaxation clock enable register X17 504. The relaxation clock enable register X17 504 is programmed at runtime through diagnostic mode input port 506 to configure the operation of the emulation system. When the relaxation clock enable register X17 504 takes logic value 1, multiplexer X16 connects the RCLK clock to the clock pin of break registers 518, 519, 558, and 559 (B1, B2, B3 and B4) to perform the emulation run in a diagnostic mode, where relaxation cycles are applied. When the relaxation clock enable register X17 504 takes logic value 0, then the multiplexer 502 connects the virtual time clock GCLK to the clock pin of registers B1, B2, B3 and B4 to perform the emulation run in a production mode, where relaxation cycles are not applied and the break registers merely output the last value generated after the last emulation clock cycle DCLK. As such, the value at the relaxation clock enable register X17 504 controls whether or not the break registers are clocked based on virtual time clock GCLK or relaxation clock RCLK (RCLK may also be deactivated or set to 0 cycles by the emulation system controlling the clock generator which supplies clocks to the device under test).

In particular, during production runs of the emulation executable, the break registers are connected to virtual time clock GCLK, while in diagnostic runs the same emulation executable is programmed to switch the clock supplied to the break registers to RCLK. During diagnostic run it is possible to introduce any number of relaxation cycles, thereby making it easy for a user to study SCC stabilization and its effect on hardware state without modifying the frequencies of top-level user clocks CK or modifying the ordering of those clocks. (As explained above, the ordering of edges of top-level user clocks CK decides the timing of the edges of the virtual time clock GCLK.)

Some aspects of embodiments further relate to enabling or disabling the readout circuitry for detecting the instability events on a per-SCC basis, or for all SCCs, in accordance with an input parameter. As noted above, the output of the value mismatch accumulator gate for each SCC is connected to a readout enable circuit. In the embodiment shown in FIG. 5, for example, the value mismatch accumulator gate X5 531 associated with the first SCC 510 has its output connected to one input of an AND gate 533 of an enable circuit, where the second input of the AND gate 533 is connected to a first SCC instability readout enable register 535. By setting the value stored in the first SCC instability readout enable register 535 to 0, the output supplied to the SCC sampling register X8 537 associated with the first SCC 510 is always set to 0 by the AND gate 533, thereby disabling the detection of instability events from the first SCC. On the other hand, by setting the value stored in the first SCC instability readout enable register 535 to 1, the AND gate 533 passes through the value output by the value mismatch accumulator gate X5 531 associated with the first SCC 510. A similar enable circuit including an AND gate 573 and a second SCC instability readout enable register 575 is connected between the value mismatch accumulator gate X9 571 and the SCC sampling register X12 577 associated with the second SCC 550.

Likewise, the output of the SCC instability accumulation gate X13 580 is connected to a global SCC instability readout enable circuit having an AND gate X14 583 controlled by a global SCC instability readout enable register X15 585, which controls the AND gate X14 583 to always output 0 (thereby disabling all reporting of instability events) or to pass through the value output by the SCC instability accumulation gate X13 580.

In some embodiments, the compiler 910 assigns a unique identifier (e.g., a unique number or SCC identification number) to each SCC detected at 420, and also generates a mapping between the unique identifier associated with an SCC and the SCC instability readout enable register that stores instability events detected from the SCC. This mapping will be referred to herein as SCC instability enable mapping information or as an SCC instability enable map.

A similar mapping is generated between registers X8 and X12 to their respective SCC identification number. This mapping will be referred to as SCC sampling register mapping information or as an SCC sampling register map.

In addition, in some embodiments, the compiler further generates references to the relaxation clock enable register X15 504 and the global instability readout enable register X15 585. The compiler also generates a reference to a virtual time clock GCLK register to access the virtual time.

Figure 6:
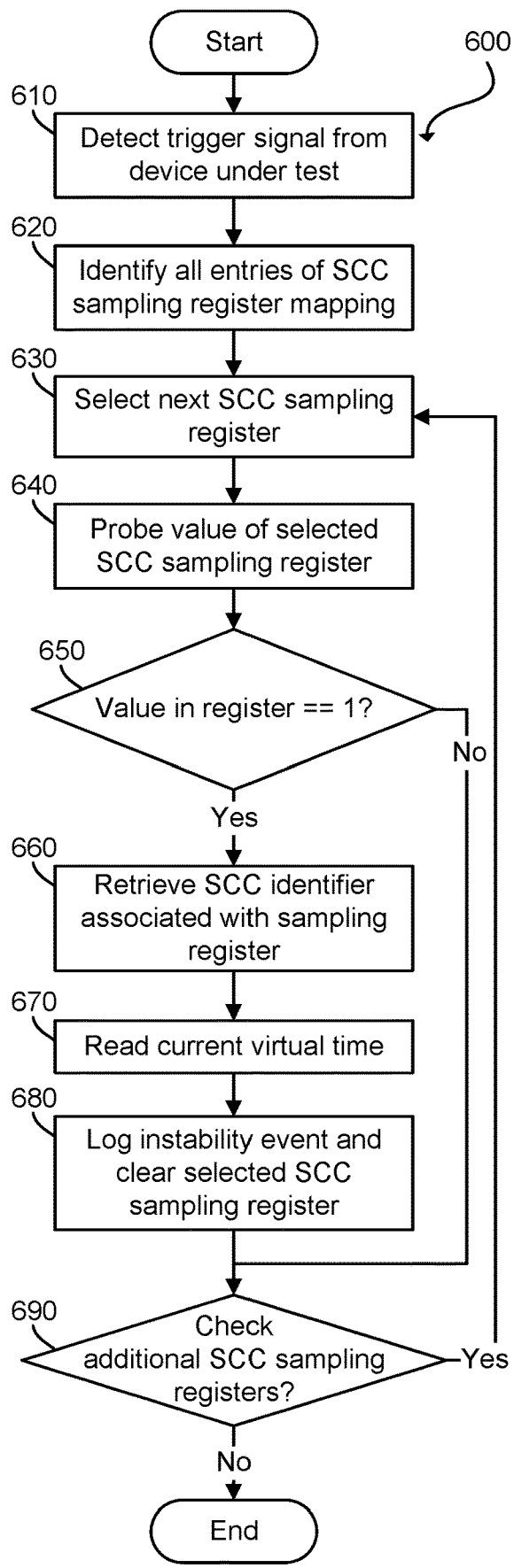
FIG. 6 is a flowchart depicting a method for identifying SCCs that generated instability events according to one embodiment of the present disclosure.

FIG. 6 is a flowchart depicting a method for identifying SCCs that generated instability events according to one embodiment of the present disclosure.

In some embodiments, the run time sub-system of emulation software 916 running on a host system 907 interrupts or pauses emulation in response to detecting, at 610, a trigger signal via a trigger signal port of the device under test (e.g., trigger signal port 590 shown in FIG. 5C), where detecting the trigger signal may include determining that the value of the trigger signal is 1 (the value is not 0). In addition, a debug sub-system of the emulation software 916 running on the host system 907 may check the value of the trigger signal received via the trigger signal port 590.

When the debug sub-system detects a logic value of 1 on this trigger signal, then the debug sub-system of the emulation software 916 identifies all of the entries of SCC sampling register mapping at 620. The debug sub-system then selects the next SCC sampling register entry in the SCC sampling register mapping at 630. At 640, the debug sub-system probes the corresponding SCC sampling register (such as first SCC sampling register X8 537 and second SCC sampling register X12 577 in the example of FIG. 5C) to test, at 650, if the SCC sampling register holds a logic value 1. If the SCC sampling register holds a logic value 1, at 660, the debug sub-system retrieves the corresponding SCC identification number or SCC identifier associated with that selected SCC sampling register. At 670, the debug subsystem reads the virtual time clock GCLK clock register for virtual time. At 680, the debug sub-system logs the instability event at this virtual time into a database or other event log in association with the SCC identification number or SCC identifier and clears the associated SCC sampling register by depositing a logic value 0 in the SCC sampling register. In some embodiments, the debug sub-system tests all the entries of sampling register mapping for detections of instability events, such as by determining if there are additional SCC sampling registers at 690 and, if there are additional SCC sampling registers, returns with selecting the next SCC sampling register at 630. After completing a check of all of the SCC sampling registers (and logging instability events captured by those registers at 680, as applicable) or, in other embodiments, after detecting a single instability event, the debug sub-system releases control to the run time sub-system of the emulation software 916 to proceed with the emulation run.

In some embodiments, the debug sub-system is configured to track or count the number of times an instability event is detected from each SCC. In some embodiments, the debug sub-system is further configured to prevent an SCC from interrupting an emulation run until the second occurrence of an instability event from that SCC (e.g., ignoring a first instability event from the SCC). In some embodiments, a threshold number of initial instability events to be ignored is configurable (e.g., to ignore the first n events). In some embodiments, an instability event can be effectively ignored by resetting the value in the SCC sampling register (with or without logging the event) and automatically resuming emulation using the run time sub-system.

Some aspects of embodiments relate to a debug sub-system that is configured to receive a list of SCC identification numbers or SCC identifiers which are to be excluded from instrumentation. In some embodiments, the compiler 910 uses the list of SCC identifiers to refrain from inserting break registers, value mismatch detectors, and value mismatch accumulators to instrument particular SCCs when the corresponding SCC identifiers appear on the list. (Likewise, in some embodiments, the list specifies particular SCCs that are to be instrumented, in which case the compiler 910 inserts break registers, value mismatch detectors, and value mismatch accumulators into the SCCs associated with SCC identifiers that appear in the list and refrains from inserting break registers into SCCs that do not appear in the list.)

In some embodiments, the list of SCC identifiers to be excluded from instrumentation (or list of SCC identifiers to be explicitly included in instrumentation) is processed after inserting instrumentation into the design (e.g., after inserting break registers, value mismatch detectors, and value mismatch accumulators), where particular SCCs are excluded from or included in instrumentation using the readout enable circuitry associated with each SCC. In particular, the debug sub-system may identify the relevant SCC instability readout enable register (e.g., instability readout enable registers X6 535 and X10 575 as shown in FIG. 5C) using the SCC identifier and the SCC instability-enable mapping. The debug sub-system (or other emulation software 916 of the host system 907) then programs these registers with logic value 0 to nullify any instability event from enabling their respective SCC sampling registers.

As discussed above, some aspects relate to readout enable circuits that selectively enable or disable the readout of instability events from particular SCCs by blocking or passing detections of instability events to their corresponding SCC sampling registers.

Some aspects of embodiments of the present disclosure relate to user interfaces for displaying reports of instability events. As noted above, in some embodiments, instability events are detected on a per-SCC basis (e.g., by checking the SCC sampling register associated with each SCC in the circuit design) and are associated with the corresponding SCC identifiers. Accordingly, in some embodiments, a user interface displays the driver-load (or upstream-downstream) relationships of SCCs in the circuit design, such as based on the SCC identifiers of the SCCs. For example, in some embodiments, a user interface depicts a floorplan or circuit diagram of the circuit design, where different SCCs are highlighted in different colors or using different patterns. Furthermore, in some embodiments the user interface further shows the driver-load relationships between SCCs, based on connections between outputs from driver SCCs to inputs of load SCCs. These connections may be depicted using line-arrow diagrams. This enables users to determine an underlying or potential root cause of oscillatory behavior, such as whether oscillatory behavior in a load (downstream) SCC may actually be caused by instability or oscillatory behavior in a driver (upstream) SCC.

Figure 7:
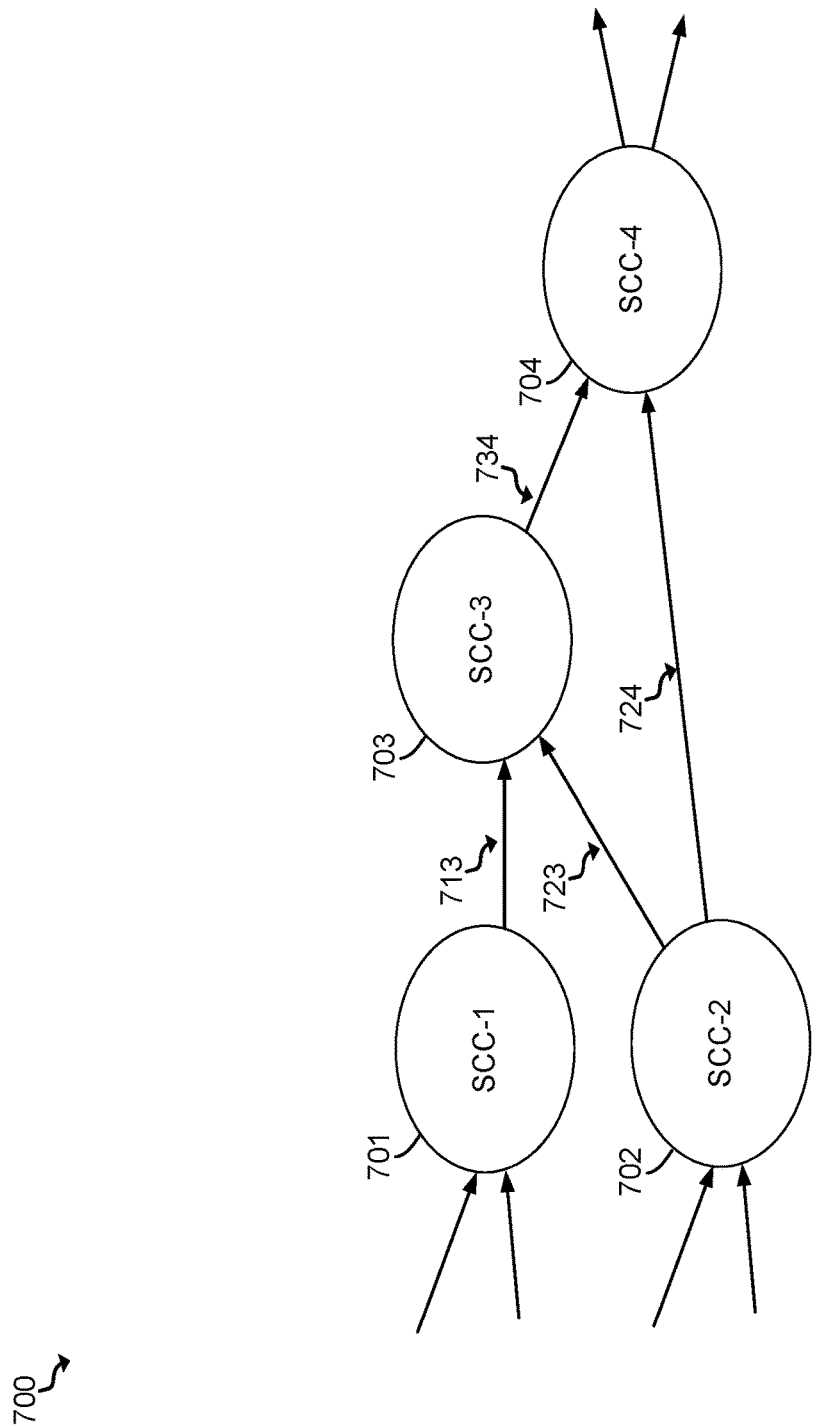
FIG. 7 is a schematic depiction of a plurality of SCCs with associated SCC identifiers and line-arrow diagrams illustrating driver-load relationships between the SCCs according to one embodiment of the present disclosure.

FIG. 7 is a schematic depiction of a plurality of SCCs with associated SCC identifiers and line-arrow diagrams illustrating driver-load relationships between the SCCs according to one embodiment of the present disclosure. FIG. 7 depicts an example of a circuit 700 that includes four SCCs: SCC-1 701, SCC-2 702, SCC-3 703, and SCC-4 704. In the arrangement shown in FIG. 7, various external inputs (e.g., other portions of the circuit 700) drive SCC-1 701 and SCC-2 702 as their loads. A line-arrow 713 from SCC-1 701 to SCC-3 703 indicates a driver-load relationship between SCC-1 701 (as the driver or upstream SCC) to SCC-3 703 (as the load or downstream SCC). Similarly, a line-arrow 723 from SCC-2 702 to SCC-3 703 indicates a similar driver-load relationship between SCC-1 701 (as the driver or upstream SCC) to SCC-3 703. Similar driver-load relationships, as indicated by the arrows 724 and 734, exist between SCC-2 702 and SCC-4 704 as well as between SCC-3 703 and SCC-4 704 respectively. Some aspects of embodiments of the present disclosure relate to presenting driver-load (or upstream-downstream) relationships between SCCs, such as that shown in FIG. 7, on a user interface of a computer system for review by a circuit designer. For example, detected instability in a load (or downstream) SCC may have a root cause in a driver (or upstream SCC), where such relationships may be apparent in a diagram such as that shown in FIG. 7. For example, if SCC-3 703 and SCC-2 both exhibit oscillatory or unstable behavior, it is possible that the oscillatory behavior of SCC-3 703 is caused by oscillatory inputs received from the output of SCC-2 702. As such, a circuit designer may first investigate and stabilize the oscillatory behavior of SCC-2 702 and determine (e.g., through further emulation) whether stabilizing the driver SCC-2 702 was sufficient to stabilize the load SCC-3 703.

Embodiments of the present disclosure provide an emulation environment, including a compiler and a debug sub-system of emulation software, for a circuit designer to study the behavior of circuit designs and to debug non-deterministic behavior of the circuit designs during emulation. As discussed above, the emulation environment is controllable to launch a full diagnostic emulation run (with a non-zero R value) throughout the emulation run. In addition, the diagnostic feature can be selectively turned on for a specific emulation time interval (e.g., one or more particular windows of user clock cycles CK), that the user already suspects to be exhibiting non-deterministic behavior or instability, where it may be assumed that the underlying cause for design non-determinism is unsettled loops at runtime.

One methodology for investigating instability or non-deterministic behavior relates to distinguishing between SCCs which are oscillatory in nature from SCCs (e.g., that never stabilize) that require a finite number of relaxation cycles to settle to a stable value. These two different scenarios can be distinguished by gradually increasing the number of relaxation cycles (R) in order to identify and exclude SCCs that eventually stabilize.

The algorithm described below according to some embodiments of the present invention has two key aspects. Firstly, the mismatches arising from unsettled SCCs are addressed in chronological order of virtual time clock GCLK timestamp. Secondly, any unsettled SCCs that are not driven by other unsettled SCCs (referred to as root SCCs) are addressed first. The algorithm finds a minimum relaxation value setting R (e.g., minimum number of relaxation cycles) needed for the non-oscillatory SCCs to eventually stabilize while also alerting the user of the unsettled or oscillatory SCCs in the process.

In more detail, the algorithm performs multiple diagnostic emulation runs with incremental increases in the number of relaxation cycles R during each diagnostic run (e.g., R=2, R=3, R=4, . . . ). Each diagnostic run with a non-zero R value saves a database or log (e.g., as generated based on the capture of instability events at 680 shown in FIG. 6) that captures the SCC identifiers and the virtual time clock GCLK time stamp of the instability event. The emulation compiler 910 also saves static compile time information that allows the user to query whether any two SCCs (distinguished by their corresponding unique identifiers) have a driver-load (or predecessor-successor or upstream-downstream) relationship to each other.

As the value of R increases from one emulation run to the next, the set of unsettled SCCs at the lowest timestamp will generally decrease (under the assumption that at least some of the SCCs eventually stabilize). The SCCs that remain in the set (e.g., after the number of SCCs that trigger events remains constant, even as R increases) are the ones which are oscillatory by nature and receive an input that causes their oscillatory nature at that timestamp.

In some embodiments, emulation software provides functionality for a user to ignore particular oscillatory SCCs (e.g., by adding a particular SCC to a list of SCCs excluded from instrumentation, as described above). This may be applicable in cases where a user determines that a particular oscillatory SCC is benign in nature, e.g., that the oscillatory output does not affect the emulation outcome or the overall behavior of the circuit. In this case, the alerts can be stubbed out (e.g., by deactivating instrumentation) and they will not appear in subsequent emulation runs.

In some embodiments, a user may determine that a particular oscillatory SCC is problematic, in which case the user may remodel the RTL or the testbench to ensure that these oscillatory SCCs are not provided with an input stimulus which causes that SCC to exhibit oscillatory behavior, because this circuit is non-deterministic by design.

After all of the unstable SCCs at this timestamp have been addressed, the user has a minimum R value (minRelaxVal) that is needed for the emulation to progress.

The algorithm then repeats the above iterative process for the next virtual time clock GCLK timestamp value showing unsettled SCCs, until all such SCCs have been addressed and the emulation runs to its conclusion.

If minRelaxVal is found to be above an acceptable threshold (say R=5), the user may conclude that a particular SCC takes longer to settle because of a poor breakpoint placement. Such SCCs can be revisited in the following compilation of the design by the compiler 910 and broken manually (e.g., by manually choosing the location of the break register) or through a better heuristic selection by the compiler 910.

Table 1, below presents the debugging methodology described above as pseudocode:

TABLE 1 algorithm find-relaxationVal is
   input: Emulation executable E, driver/load relationship database
   output: minRelaxVal
   minRelaxVal ← 1
   while true
      Run E with R = minRelaxVal;
      Read the oscillation monitor database and extract the set of
unsettled SCCs (S) at the lowest timestamp N;
      if S is empty
         break;
      endif
      Remove from S any SCCs that are not root SCCs, let this new set be
S;
      for each relaxVal in [minRelaxVal, 15] do
         Run E with R = relaxVal upto N;
         for each SCC in S' do
            if SCC is settled then
               minRelaxVal ← relaxVal;
               Remove SCC from S' ;
            endif
         end for
         if S' is empty
            break;
         endif
      end for
      S' is comprised of oscillatory SCCs that are unsettled at timestamp
N, for all relaxation values;
      Disable alerts arising from these or fix them in RTL.
   end while
   return minRelaxVal;

Accordingly, aspects of the present disclosure relate to techniques for detecting instability arising from combinational loops or SCCs in an integrated circuit design. Some techniques relate to automatically detecting combinational loops or SCCs and inserting break registers to break these loops and inserting readout circuits to detect changes in output values of the loop by comparing the values at the D and Q pins of the break registers. When running an emulation in a diagnostic mode, break registers are clocked using a relaxation clock (RCLK), where the relaxation clock is supplied only to the break registers and supplied at the end of each user clock cycle (before the next edge of a user clock CK) and not to other circuit elements in the design, such that the behavior of the combinational loops or SCCs are studied in isolation (e.g., with inputs to the loops or SCCs held constant). A debug sub-system of emulation software running on a host system connected to hardware emulating the device under test manages the emulation process for studying loop or SCC instability by associating each loop with a unique SCC identifier and detecting which loops generate instability events (e.g., where value mismatches are detected during or after the relaxation cycles). The debug sub-system may further control the number of relaxation cycles used during each diagnostic run to investigate the number of relaxation cycles needed for the damped oscillatory combinational loops or SCCs to stabilize their outputs and also to explore or detect combinational loops or SCCs that appear to have oscillatory nature and that do not settle, even when a large number of relaxation cycles is used.

Figure 8:
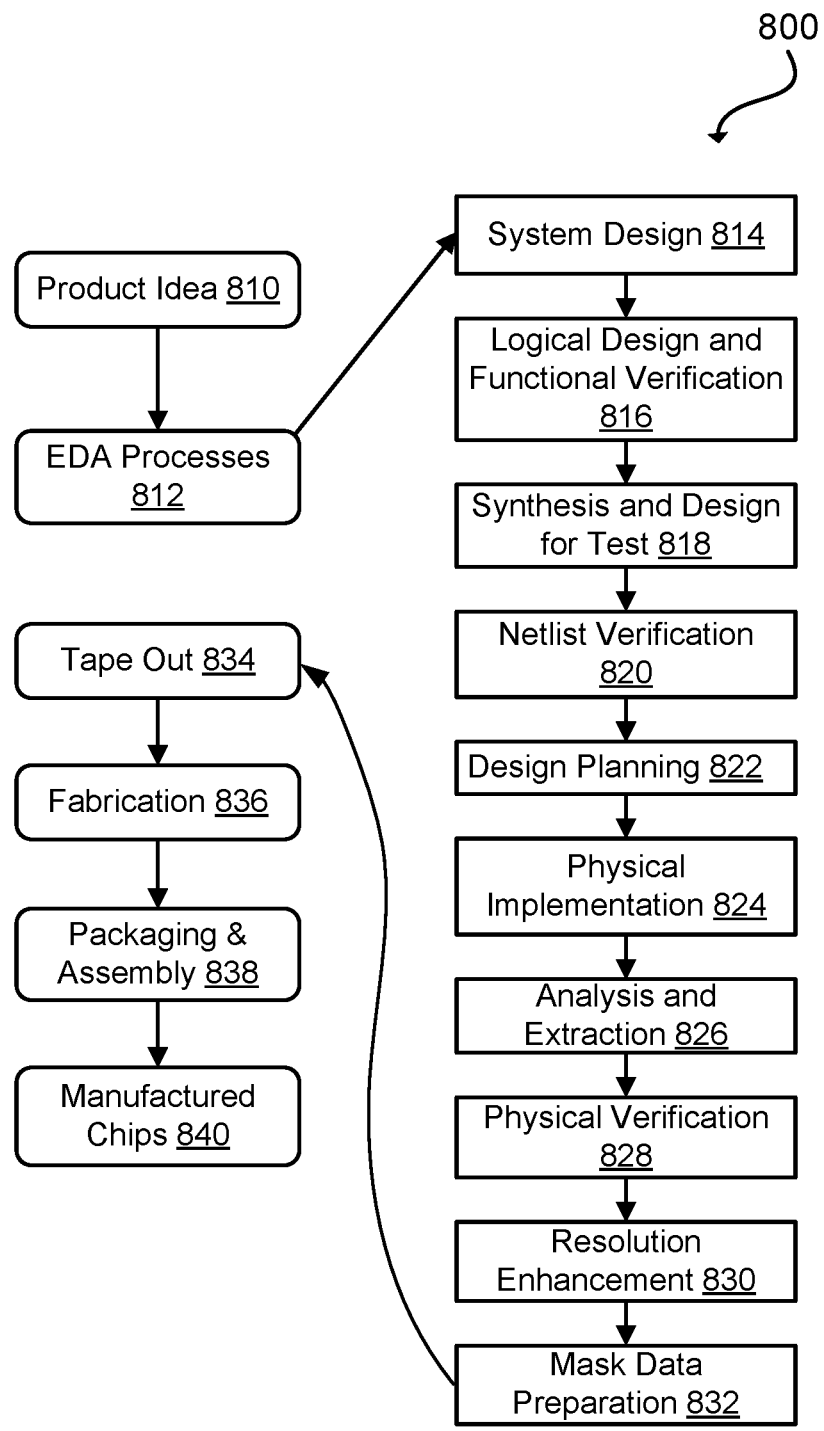
FIG. 8 depicts a flowchart of various processes used during the design and manufacture of an integrated circuit in accordance with some embodiments of the present disclosure.

FIG. 8 illustrates an example set of processes 800 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 810 with information supplied by a designer, information which is transformed to create an article of manufacture that uses a set of EDA processes 812. When the design is finalized, the design is taped-out 834, which is when artwork (e.g., geometric patterns) for the integrated circuit is sent to a fabrication facility to manufacture the mask set, which is then used to manufacture the integrated circuit. After tape-out, a semiconductor die is fabricated 836 and packaging and assembly processes 838 are performed to produce the finished integrated circuit 840.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding systems of that layer (e.g., a formal verification system). A design process may use a sequence depicted in FIG. 8. The processes described by be enabled by EDA products (or EDA systems).

During system design 814, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 816, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 818, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 820, the netlist is checked for compliance with timing constraints and for correspondence with the HDL code. During design planning 822, an overall floor plan for the integrated circuit is constructed and analyzed for timing and top-level routing.

During layout or physical implementation 824, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 826, the circuit function is verified at the layout level, which permits refinement of the layout design. During physical verification 828, the layout design is checked to ensure that manufacturing constraints are correct, such as DRC constraints, electrical constraints, lithographic constraints, and that circuitry function matches the HDL design specification. During resolution enhancement 830, the geometry of the layout is transformed to improve how the circuit design is manufactured.

During tape-out, data is created to be used (after lithographic enhancements are applied if appropriate) for production of lithography masks. During mask data preparation 832, the 'tape-out' data is used to produce lithography masks that are used to produce finished integrated circuits.

A storage subsystem of a computer system (such as computer system 900 of FIG. 9, or host system 907 of FIG. 9) may be used to store the programs and data structures that are used by some or all of the EDA products described herein, and products used for development of cells for the library and for physical and logical design that use the library.

FIG. 9 depicts a diagram of an example emulation environment 900. An emulation environment 900 may be configured to verify the functionality of the circuit design. The emulation environment 900 may include a host system 907 (e.g., a computer that is part of an EDA system) and an emulation system 902 (e.g., a set of programmable devices such as Field Programmable Gate Arrays (FPGAs) or processors). The host system generates data and information by using a compiler 910 to structure the emulation system to emulate a circuit design. A circuit design to be emulated is also referred to as a Design Under Test ('DUT') where data and information from the emulation are used to verify the functionality of the DUT.

The host system 907 may include one or more processors. In the embodiment where the host system includes multiple processors, the functions described herein as being performed by the host system can be distributed among the multiple processors. The host system 907 may include a compiler 910 to transform specifications written in a description language that represents a DUT and to produce data (e.g., binary data) and information that is used to structure the emulation system 902 to emulate the DUT. The compiler 910 can transform, change, restructure, add new functions to, and/or control the timing of the DUT.

The host system 907 and emulation system 902 exchange data and information using signals carried by an emulation connection. The connection can be, but is not limited to, one or more electrical cables such as cables with pin structures compatible with the Recommended Standard 232 (RS232) or universal serial bus (USB) protocols. The connection can be a wired communication medium or network such as a local area network or a wide area network such as the Internet. The connection can be a wireless communication medium or a network with one or more points of access using a wireless protocol such as BLUETOOTH or IEEE 802.11. The host system 907 and emulation system 902 can exchange data and information through a third device such as a network server.

The emulation system 902 includes multiple FPGAs (or other modules) such as FPGAs $904_1$ and $904_2$ as well as additional FPGAs to $904_N$. Each FPGA can include one or more FPGA interfaces through which the FPGA is connected to other FPGAs (and potentially other emulation components) for the FPGAs to exchange signals. An FPGA interface can be referred to as an input/output pin or an FPGA pad. While an emulator may include FPGAs, embodiments of emulators can include other types of logic blocks instead of, or along with, the FPGAs for emulating DUTs. For example, the emulation system 902 can include custom FPGAs, specialized ASICs for emulation or prototyping, memories, and input/output devices.

A programmable device can include an array of programmable logic blocks and a hierarchy of interconnections that can enable the programmable logic blocks to be interconnected according to the descriptions in the HDL code. Each of the programmable logic blocks can enable complex combinational functions or enable logic gates such as AND, and XOR logic blocks. In some embodiments, the logic blocks also can include memory elements/devices, which can be simple latches, flip-flops, or other blocks of memory. Depending on the length of the interconnections between different logic blocks, signals can arrive at input terminals of the logic blocks at different times and thus may be temporarily stored in the memory elements/devices.

FPGAs $904_1$-$904_N$ may be placed onto one or more boards $912_1$ and $912_2$ as well as additional boards through $912_M$. Multiple boards can be placed into an emulation unit $914_1$. The boards within an emulation unit can be connected using the backplane of the emulation unit or any other types of connections. In addition, multiple emulation units (e.g., $914_1$ and $914_2$ through $914_K$) can be connected to each other by cables or any other means to form a multi-emulation unit system.

For a DUT that is to be emulated, the host system 907 transmits one or more bit files to the emulation system 902. The bit files may specify a description of the DUT and may further specify partitions of the DUT created by the host system 907 with trace and injection logic, mappings of the partitions to the FPGAs of the emulator, and design constraints. Using the bit files, the emulator structures the FPGAs to perform the functions of the DUT. In some embodiments, one or more FPGAs of the emulators may have the trace and injection logic built into the silicon of the FPGA. In such an embodiment, the FPGAs may not be structured by the host system to emulate trace and injection logic.

The host system 907 receives a description of a DUT that is to be emulated. In some embodiments, the DUT description is in a description language (e.g., a register transfer language (RTL)). In some embodiments, the DUT description is in netlist level files or a mix of netlist level files and HDL files. If part of the DUT description or the entire DUT description is in an HDL, then the host system can synthesize the DUT description to create a gate level netlist using the DUT description. A host system can use the netlist of the DUT to partition the DUT into multiple partitions where one or more of the partitions include trace and injection logic. The trace and injection logic traces interface signals that are exchanged via the interfaces of an FPGA. Additionally, the trace and injection logic can inject traced interface signals into the logic of the FPGA. The host system maps each partition to an FPGA of the emulator. In some embodiments, the trace and injection logic is included in select partitions for a group of FPGAs. The trace and injection logic can be built into one or more of the FPGAs of an emulator. The host system can synthesize multiplexers to be mapped into the FPGAs. The multiplexers can be used by the trace and injection logic to inject interface signals into the DUT logic.

The host system creates bit files describing each partition of the DUT and the mapping of the partitions to the FPGAs. For partitions in which trace and injection logic are included, the bit files also describe the logic that is included. The bit files can include place and route information and design constraints. The host system stores the bit files and information describing which FPGAs are to emulate each component of the DUT (e.g., to which FPGAs each component is mapped).

Upon request, the host system transmits the bit files to the emulator. The host system signals the emulator to start the emulation of the DUT. During emulation of the DUT or at the end of the emulation, the host system receives emulation results from the emulator through the emulation connection. Emulation results are data and information generated by the emulator during the emulation of the DUT which include interface signals and states of interface signals that have been traced by the trace and injection logic of each FPGA. The host system can store the emulation results and/or transmits the emulation results to another processing system.

After emulation of the DUT, a circuit designer can request to debug a component of the DUT. If such a request is made, the circuit designer can specify a time period of the emulation to debug. The host system identifies which FPGAs are emulating the component using the stored information. The host system retrieves stored interface signals associated with the time period and traced by the trace and injection logic of each identified FPGA. The host system signals the emulator to re-emulate the identified FPGAs. The host system transmits the retrieved interface signals to the emulator to re-emulate the component for the specified time period. The trace and injection logic of each identified FPGA injects its respective interface signals received from the host system into the logic of the DUT mapped to the FPGA. In case of multiple re-emulations of an FPGA, merging the results produces a full debug view.

The host system receives, from the emulation system, signals traced by logic of the identified FPGAs during the re-emulation of the component. The host system stores the signals received from the emulator. The signals traced during the re-emulation can have a higher sampling rate than the sampling rate during the initial emulation. For example, in the initial emulation a traced signal can include a saved state of the component every X milliseconds. However, in the re-emulation the traced signal can include a saved state every Y milliseconds where Y is less than X. If the circuit designer requests to view a waveform of a signal traced during the re-emulation, the host system can retrieve the stored signal and display a plot of the signal. For example, the host system can generate a waveform of the signal. Afterwards, the circuit designer can request to re-emulate the same component for a different time period or to re-emulate another component.

A host system 907 and/or the compiler 910 may include sub-systems such as, but not limited to, a design synthesizer sub-system, a mapping sub-system, a run time sub-system, a results sub-system, a debug sub-system, a waveform sub-system, and a storage sub-system. The sub-systems can be structured and enabled as individual or multiple modules or two or more may be structured as a module. Together these sub-systems structure the emulator and monitor the emulation results. In some embodiments, one or more of these sub-systems will be referred to herein as being sub-systems that are part of emulation software 916.

The design synthesizer sub-system transforms the HDL that is representing a DUT 905 into gate level logic. For a DUT that is to be emulated, the design synthesizer sub-system receives a description of the DUT. If the description of the DUT is fully or partially in HDL (e.g., RTL or other level of representation), the design synthesizer sub-system synthesizes the HDL of the DUT to create a gate-level netlist with a description of the DUT in terms of gate level logic.

The mapping sub-system partitions DUTs and maps the partitions into emulator FPGAs. The mapping sub-system partitions a DUT at the gate level into a number of partitions using the netlist of the DUT. For each partition, the mapping sub-system retrieves a gate level description of the trace and injection logic and adds the logic to the partition. As described above, the trace and injection logic included in a partition is used to trace signals exchanged via the interfaces of an FPGA to which the partition is mapped (trace interface signals). The trace and injection logic can be added to the DUT prior to the partitioning. For example, the trace and injection logic can be added by the design synthesizer sub-system prior to or after the synthesizing the HDL of the DUT.

In addition to including the trace and injection logic, the mapping sub-system can include additional tracing logic in a partition to trace the states of certain DUT components that are not traced by the trace and injection. The mapping sub-system can include the additional tracing logic in the DUT prior to the partitioning or in partitions after the partitioning. The design synthesizer sub-system can include the additional tracing logic in an HDL description of the DUT prior to synthesizing the HDL description.

The mapping sub-system maps each partition of the DUT to an FPGA of the emulator. For partitioning and mapping, the mapping sub-system uses design rules, design constraints (e.g., timing or logic constraints), and information about the emulator. For components of the DUT, the mapping sub-system stores information in the storage sub-system describing which FPGAs are to emulate each component.

Using the partitioning and the mapping, the mapping sub-system generates one or more bit files that describe the created partitions and the mapping of logic to each FPGA of the emulator. The bit files can include additional information such as constraints of the DUT and routing information of connections between FPGAs and connections within each FPGA. The mapping sub-system can generate a bit file for each partition of the DUT and can store the bit file in the storage sub-system. Upon request from a circuit designer, the mapping sub-system transmits the bit files to the emulator, and the emulator can use the bit files to structure the FPGAs to emulate the DUT.

If the emulator includes specialized ASICs that include the trace and injection logic, the mapping sub-system can generate a specific structure that connects the specialized ASICs to the DUT. In some embodiments, the mapping sub-system can save the information of the traced/injected signal and where the information is stored on the specialized ASIC.

The run time sub-system controls emulations performed by the emulator. The run time sub-system can cause the emulator to start or stop executing an emulation. Additionally, the run time sub-system can provide input signals and data to the emulator. The input signals can be provided directly to the emulator through the connection or indirectly through other input signal devices. For example, the host system can control an input signal device to provide the input signals to the emulator. The input signal device can be, for example, a test board (directly or through cables), signal generator, another emulator, or another host system.

The results sub-system processes emulation results generated by the emulator. During emulation and/or after completing the emulation, the results sub-system receives emulation results from the emulator generated during the emulation. The emulation results include signals traced during the emulation. Specifically, the emulation results include interface signals traced by the trace and injection logic emulated by each FPGA and can include signals traced by additional logic included in the DUT. Each traced signal can span multiple cycles of the emulation. A traced signal includes multiple states and each state is associated with a time of the emulation. The results sub-system stores the traced signals in the storage sub-system. For each stored signal, the results sub-system can store information indicating which FPGA generated the traced signal.

The debug sub-system allows circuit designers to debug DUT components. After the emulator has emulated a DUT and the results sub-system has received the interface signals traced by the trace and injection logic during the emulation, a circuit designer can request to debug a component of the DUT by re-emulating the component for a specific time period. In a request to debug a component, the circuit designer identifies the component and indicates a time period of the emulation to debug. The circuit designer's request can include a sampling rate that indicates how often states of debugged components should be saved by logic that traces signals.

The debug sub-system identifies one or more FPGAs of the emulator that are emulating the component using the information stored by the mapping sub-system in the storage sub-system. For each identified FPGA, the debug sub-system retrieves, from the storage sub-system, interface signals traced by the trace and injection logic of the FPGA during the time period indicated by the circuit designer. For example, the debug sub-system retrieves states traced by the trace and injection logic that are associated with the time period.

The debug sub-system transmits the retrieved interface signals to the emulator. The debug sub-system instructs the debug sub-system to use the identified FPGAs and for the trace and injection logic of each identified FPGA to inject its respective traced signals into logic of the FPGA to re-emulate the component for the requested time period. The debug sub-system can further transmit the sampling rate provided by the circuit designer to the emulator so that the tracing logic traces states at the proper intervals.

To debug the component, the emulator can use the FPGAs to which the component has been mapped. Additionally, the re-emulation of the component can be performed at any point specified by the circuit designer.

For an identified FPGA, the debug sub-system can transmit instructions to the emulator to load multiple emulator FPGAs with the same configuration of the identified FPGA. The debug sub-system additionally signals the emulator to use the multiple FPGAs in parallel. Each FPGA from the multiple FPGAs is used with a different time window of the interface signals to generate a larger time window in a shorter amount of time. For example, the identified FPGA can require an hour or more to use a certain amount of cycles. However, if multiple FPGAs have the same data and structure of the identified FPGA and each of these FPGAs runs a subset of the cycles, the emulator can require a few minutes for the FPGAs to collectively use all the cycles.

A circuit designer can identify a hierarchy or a list of DUT signals to re-emulate. To enable this, the debug sub-system determines the FPGA needed to emulate the hierarchy or list of signals, retrieves the necessary interface signals, and transmits the retrieved interface signals to the emulator for re-emulation. Thus, a circuit designer can identify any element (e.g., component, device, or signal) of the DUT to debug/re-emulate.

The waveform sub-system generates waveforms using the traced signals. If a circuit designer requests to view a waveform of a signal traced during an emulation run, the host system retrieves the signal from the storage sub-system. The waveform sub-system displays a plot of the signal. For one or more signals, when the signals are received from the emulator, the waveform sub-system can automatically generate the plots of the signals.

Figure 10:
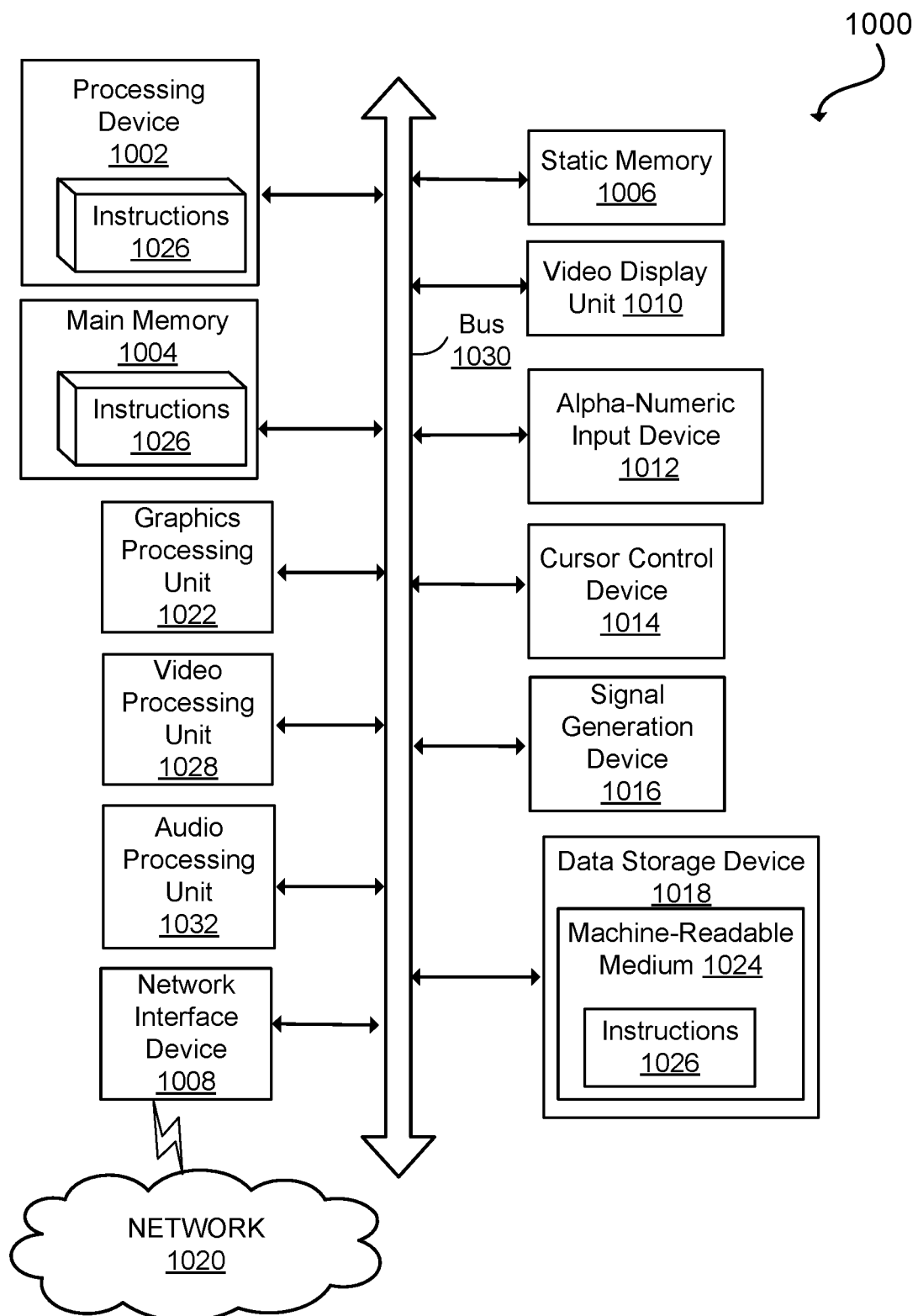
FIG. 10 depicts a diagram of an example computer system in which embodiments of the present disclosure may operate.

FIG. 10 illustrates an example machine of a computer system 1000 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1000 includes a processing device 1002, a main memory 1004 (e.g., read-only memory (ROM), flash memory, dynamic random access memory (DRAM) such as synchronous DRAM (SDRAM), a static memory 1006 (e.g., flash memory, static random access memory (SRAM), etc.), and a data storage device 1018, which communicate with each other via a bus 1030.

Processing device 1002 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1002 may also be one or more special-purpose processing devices such as an application specific integrated circuit (ASIC), a field programmable gate array (FPGA), a digital signal processor (DSP), network processor, or the like. The processing device 1002 may be configured to execute instructions 1026 for performing the operations and steps described herein.

The computer system 1000 may further include a network interface device 1008 to communicate over the network 1020. The computer system 1000 also may include a video display unit 1010 (e.g., a liquid crystal display (LCD) or a cathode ray tube (CRT)), an alphanumeric input device 1012 (e.g., a keyboard), a cursor control device 1014 (e.g., a mouse), a graphics processing unit 1022, a signal generation device 1016 (e.g., a speaker), graphics processing unit 1022, video processing unit 1028, and audio processing unit 1032.

The data storage device 1018 may include a machine-readable storage medium 1024 (also known as a non-transitory computer-readable medium) on which is stored one or more sets of instructions 1026 or software embodying any one or more of the methodologies or functions described herein. The instructions 1026 may also reside, completely or at least partially, within the main memory 1004 and/or within the processing device 1002 during execution thereof by the computer system 1000, the main memory 1004 and the processing device 1002 also constituting machine-readable storage media.

In some implementations, the instructions 1026 include instructions to implement functionality corresponding to the present disclosure. While the machine-readable storage medium 1024 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1002 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method comprising:
  loading a circuit design comprising a plurality of combinational elements and controlled by a user clock;
  detecting a plurality of strongly connected components (SCCs) corresponding to the plurality of combinational elements in the circuit design;
  inserting a plurality of break registers into the circuit design, each break register being between two combinational elements of a corresponding SCC of the plurality of SCCs to break the corresponding SCC, the plurality of break registers being clocked by a relaxation clock;
  detecting, by a processor, during an emulation run of the circuit design, one or more value mismatches across an input pin and an output pin of one or more break registers of the plurality of break registers based on a relaxation cycle of the relaxation clock, the one or more break registers being associated with one or more SCCs exhibiting instability; and
  reporting an instability event based on the one or more value mismatches.

2. The method of claim 1, wherein the detecting the one or more value mismatches comprises executing an emulation run of the circuit design as a design under test implemented in an emulation system comprising one or more programmable devices,
  wherein the processor controls a clock generator to supply a plurality of clock signals to the design under test during the emulation run, the clock signals comprising:
    a user clock signal corresponding to the user clock;
    an emulation clock signal; and
    a relaxation clock signal corresponding to the relaxation clock, wherein each cycle of the relaxation clock signal has a period equal to a period of each cycle of the emulation clock signal,
  wherein, between a first edge and an adjacent second edge of the user clock signal, the clock generator supplies one or more cycles of the emulation clock signal followed by R relaxation clock cycles of the relaxation clock signal.

3. The method of claim 1, further comprising:
  assigning a unique SCC identifier to each SCC of the plurality of SCCs;
  storing the one or more value mismatches in association with the unique SCC identifier corresponding to the one or more SCCs exhibiting instability; and
  generating a trigger signal based on the one or more value mismatches.

4. The method of claim 3, further comprising:
  disabling readout and storage of a value mismatch in a specified SCC of the plurality of SCCs in accordance with the unique SCC identifier of the specified SCC.

5. The method of claim 3, further comprising:
  determining that the emulation run was interrupted due to instability based on the trigger signal.

6. The method of claim 3, further comprising identifying the one or more SCCs exhibiting instability based on the unique SCC identifier of the one or more value mismatches.

7. The method of claim 3, wherein the reporting the instability event based on the one or more value mismatches comprises displaying the unique SCC identifier associated with each of the one or more SCCs exhibiting instability, wherein a driver-load relationship between at least two of the one or more SCCs exhibiting instability is illustrated using a line-arrow diagram.

8. The method of claim 1, further comprising:
  assigning a unique SCC identifier to each SCC of the plurality of SCCs; and
  loading a list of SCC identifiers specifying one or more excluded SCCs from among the plurality of SCCs,
  wherein the processor refrains from inserting break registers into the circuit design between combinational elements of the one or more excluded SCCs.

9. The method of claim 1, wherein the instability event is associated with a virtual time based on the user clock.

10. The method of claim 1, further comprising:
  tracking a number of times instability events are detected from each SCC; and refraining from reporting the instability event when the number of times is below a threshold number.

11. A system comprising:
an emulation system comprising one or more programmable devices;
a memory storing instructions; and
a processor, coupled with the memory and to execute the instructions, the instructions when executed cause the processor to:
load a circuit design comprising a plurality of combinational elements and controlled by a user clock;
detect a plurality of strongly connected components (SCCs) corresponding to the plurality of combinational elements in the circuit design;
insert a plurality of break registers into the circuit design, each break register being between two combinational elements of a corresponding SCC of the plurality of SCCs to break the corresponding SCC;
program the one or more programmable devices of the emulation system based on the circuit design to implement a design under test; and
execute an emulation run of the circuit design using the emulation system, comprising:
detecting one or more value mismatches across an input pin and an output pin of one or more break registers of the plurality of break registers clocked based on a relaxation clock, the one or more break registers being associated with one or more SCCs exhibiting instability; and
reporting an instability event based on the one or more value mismatches.

12. The system of claim 11, wherein the instructions to execute the emulation run further comprise instructions that, when executed, cause the processor to control a clock generator to supply a plurality of clock signals to the design under test, the plurality of clock signals comprising:
a user clock signal corresponding to the user clock;
an emulation clock signal; and
a relaxation clock signal corresponding to the relaxation clock, wherein each cycle of the relaxation clock signal has a period equal to a period of each cycle of the emulation clock signal,
wherein, between a first edge and an adjacent second edge of the user clock signal, the clock generator supplies one or more cycles of the emulation clock signal followed by R relaxation clock cycles of the relaxation clock signal.

13. The system of claim 12, wherein the clock generator supplies the R relaxation clock cycles of emulation clock just before the adjacent second edge of the user clock signal.

14. The system of claim 11, wherein the instructions further comprise instructions that, when executed, cause the processor to:
insert a plurality of value mismatch detectors into the circuit design, each value mismatch detector of the plurality of value mismatch detectors having a first input and a second input connected to a D pin and a Q pin of a corresponding break register of the plurality of break registers,
wherein the one or more value mismatches are detected based on a plurality of outputs of the plurality of value mismatch detectors.

15. The system of claim 14, wherein the instructions further comprise instructions that, when executed, cause the processor to:
insert a plurality of value mismatch accumulators into the circuit design, each value mismatch accumulator being configured to collect the outputs of the value mismatch detectors associated with a corresponding SCC of the plurality of SCCs;
insert a plurality of SCC sampling registers into the circuit design, each of the plurality of SCC sampling registers being associated with a corresponding one of the plurality of SCCs and a corresponding unique SCC identifier and having an input connected to an output of a corresponding value mismatch accumulator of the plurality of value mismatch accumulators; and
store the one or more value mismatches in one or more corresponding SCC sampling registers from among the plurality of SCC sampling registers.

16. The system of claim 15, wherein the instructions further comprise instructions that, when executed, cause the processor to:
insert a plurality of readout enable circuits into the circuit design, each of the readout enable circuits being associated with one of the plurality of SCCs, wherein the readout enable circuit is connected between the corresponding value mismatch accumulator and a corresponding SCC sampling register,
wherein the readout enable circuit comprises an AND gate having:
a first input connected to an output of the corresponding value mismatch accumulator;
a second input connected to a corresponding SCC instability readout enable register; and
an output connected to an input of the corresponding SCC sampling register.

17. The system of claim 16, wherein the instructions further comprise instructions that, when executed, cause the processor to:
insert an SCC instability accumulation gate, wherein outputs of the plurality of SCC sampling registers are connected to inputs of the SCC instability accumulation gate and the SCC instability accumulation gate is configured to generate a trigger signal reporting an instability event in the one or more SCCs exhibiting instability.

18. The system of claim 17, wherein the instructions further comprise instructions that, when executed, cause the processor to:
insert a global enable SCC instability enable readout circuit connected between an output of the SCC instability accumulation gate and a trigger signal port.

19. The system of claim 17, wherein the instructions further comprise instructions that, when executed, cause the processor to:
interrupt the emulation run in response to detecting the trigger signal.

20. The system of claim 11, wherein the instructions further comprise instructions that, when executed, cause the processor to:
insert a multiplexer configured to selectively clock the plurality of break registers based on the relaxation clock when operating in a diagnostic mode and to clock the plurality of break registers based on a virtual time clock when operating in a production mode.

* * * * *